United States Patent [19]
Kimura et al.

[11] Patent Number: 5,311,039
[45] Date of Patent: May 10, 1994

[54] PROM AND ROM MEMORY CELLS

[75] Inventors: Masakazu Kimura; Toshihiko Kondo, both of Suwa, Japan

[73] Assignee: Seiko Epson Corporation, Tokyo, Japan

[21] Appl. No.: 689,222

[22] Filed: Apr. 22, 1991

[30] Foreign Application Priority Data

| Apr. 24, 1990 | [JP] | Japan | 2-108015 |
| Apr. 24, 1990 | [JP] | Japan | 2-108016 |
| Apr. 24, 1990 | [JP] | Japan | 2-108017 |
| Jun. 6, 1990 | [JP] | Japan | 2-148068 |
| Jun. 6, 1990 | [JP] | Japan | 2-148087 |
| Jun. 8, 1990 | [JP] | Japan | 2-150148 |
| Jul. 26, 1990 | [JP] | Japan | 2-198819 |
| Aug. 7, 1990 | [JP] | Japan | 2-208960 |
| Aug. 7, 1990 | [JP] | Japan | 2-208961 |
| Aug. 7, 1990 | [JP] | Japan | 2-208962 |
| Aug. 17, 1990 | [JP] | Japan | 2-216496 |

[51] Int. Cl.$^5$ .......................... H01L 29/04
[52] U.S. Cl. .......................... 257/50; 257/73; 257/530; 257/756; 257/922
[58] Field of Search ............... 257/50, 73, 529, 530, 257/391, 756, 922

[56] References Cited

U.S. PATENT DOCUMENTS

| 4,420,820 | 12/1983 | Preedy | 357/59 A |
| 4,424,579 | 1/1984 | Roesner | 365/105 |
| 4,442,507 | 4/1984 | Roesner | 365/96 |
| 4,494,135 | 1/1985 | Moussie | 257/50 |
| 4,569,121 | 2/1986 | Lim et al. | 357/51 |
| 4,598,386 | 1/1986 | Roesner et al. | 365/105 |
| 4,796,074 | 1/1989 | Roesner | 365/96 |
| 5,070,384 | 12/1991 | McCollum et al. | 357/67 |

OTHER PUBLICATIONS

Y. Shacham-Diamand et al., "A Novel Ion-Implanted Amorphous Silicon Programmable Element," IEDM-87, pp. 194–197.

E. Hamdy, et al., "Dielectric Based Antifuse for Logic and Memory ICs," IEDM-88, pp. 786–789.

Primary Examiner—Sara W. Crane
Attorney, Agent, or Firm—Harold T. Tsiang

[57] ABSTRACT

An antifuse memory cell having a P+ polysilicon doping in a region directly under an intrinsic silicon programming layer. The P+ polysilicon region is surrounded by an N− polysilicon doped region, and the two regions are sandwiched between layers of silicon dioxide insulation. The interface between the two regions is a P-N junction, in fact, a diode. The diode does not suffer from a diffusion current that increases with increasing levels of N− doping, therefore the N− polysilicon can be heavily doped to yield a very conductive bit line interconnect for a memory matrix. The interconnect line widths can be very narrow, and further microminiaturization is aided thereby. The top metalization is aluminum and serves as a word line interconnect in the memory matrix.

24 Claims, 21 Drawing Sheets

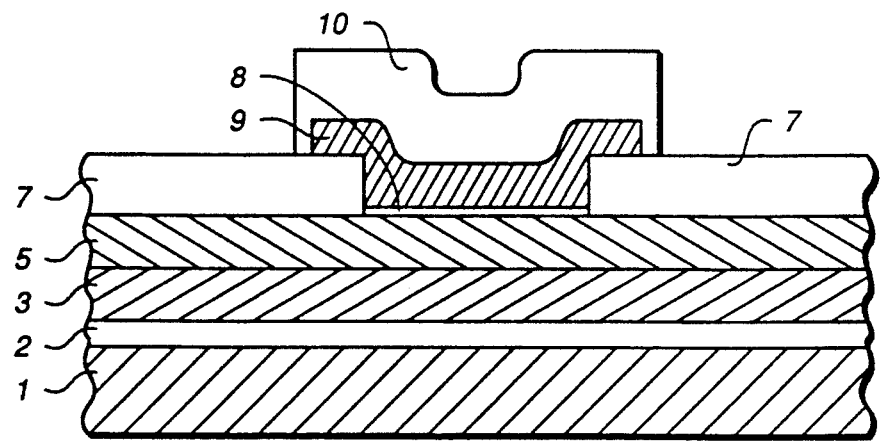
FIG._1
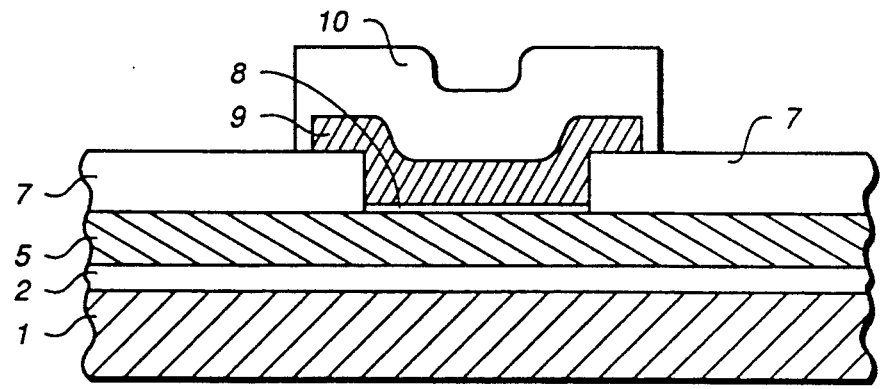
FIG._3
(PRIOR ART)
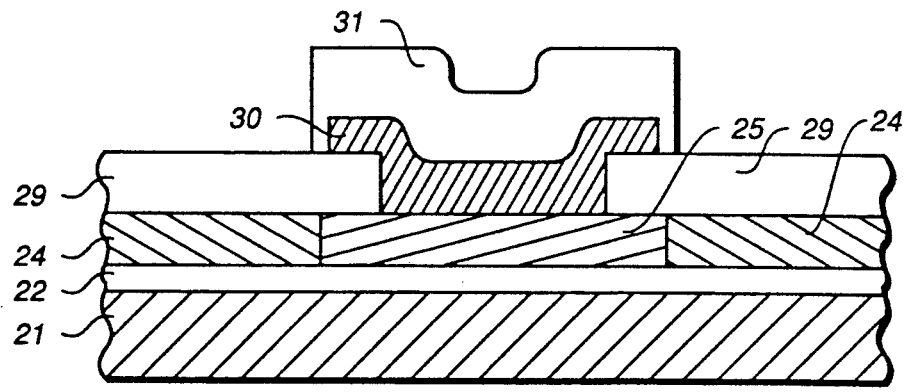
FIG._5

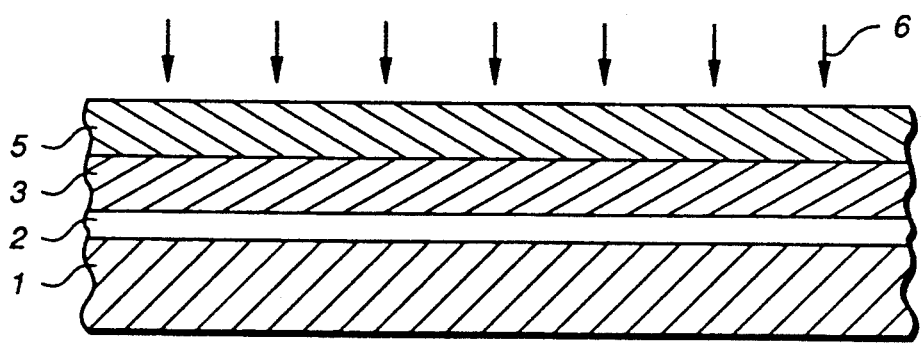
FIG._2A
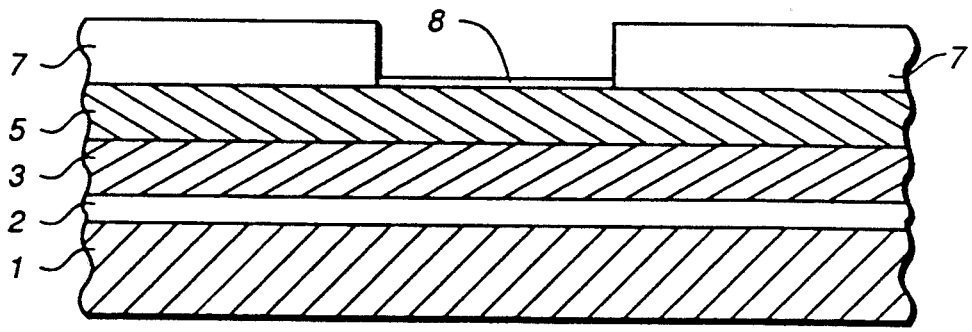
FIG._2B
FIG._2C
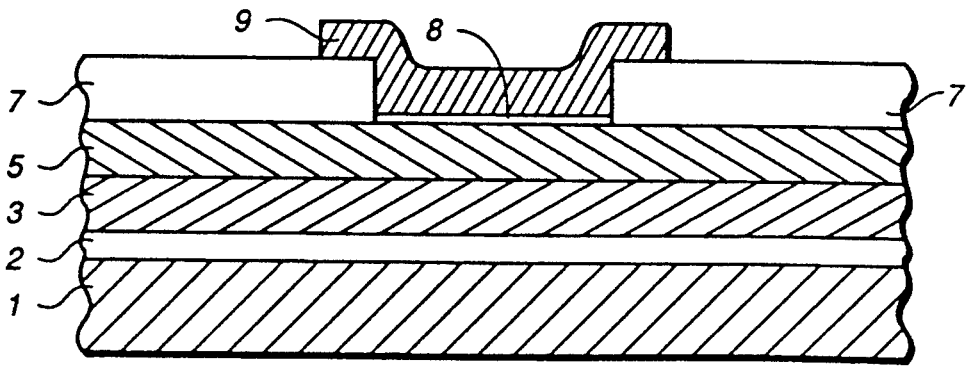
FIG._2D

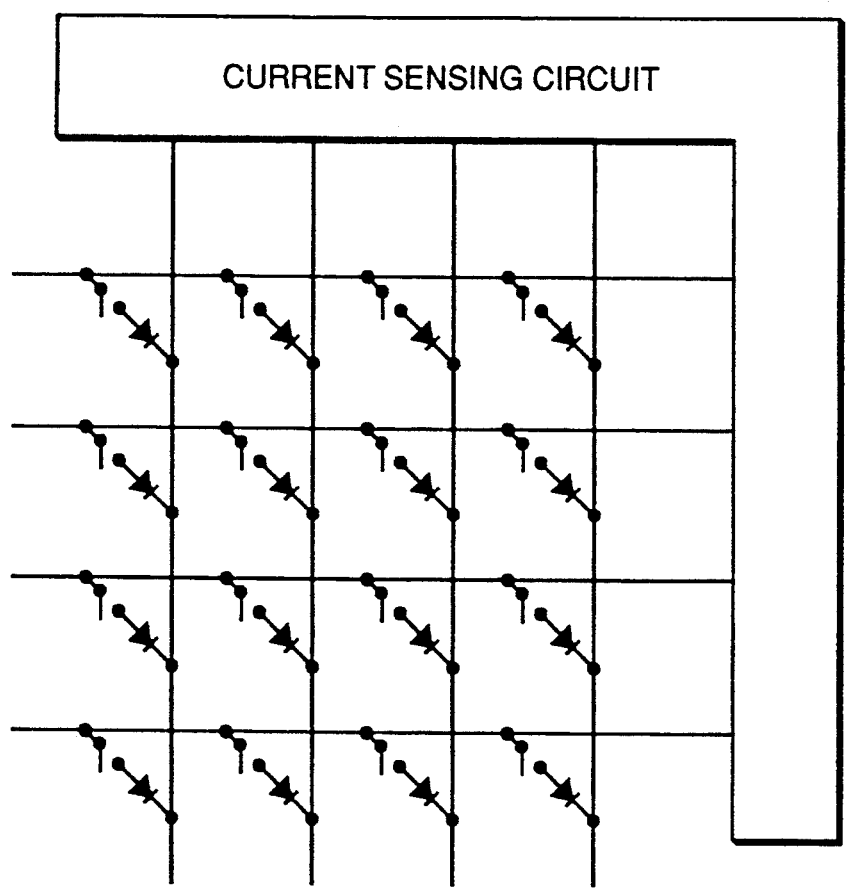
FIG._4

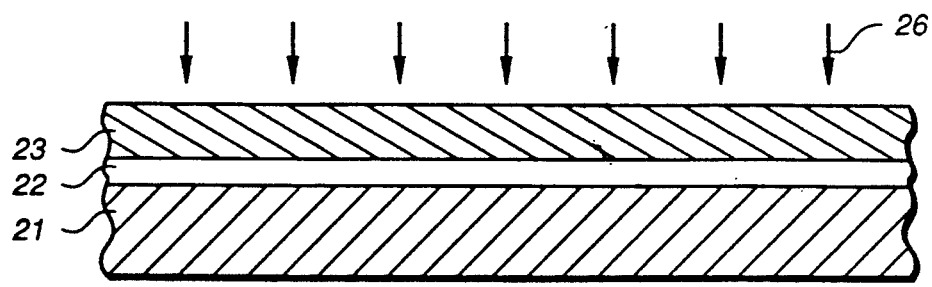
FIG._6A
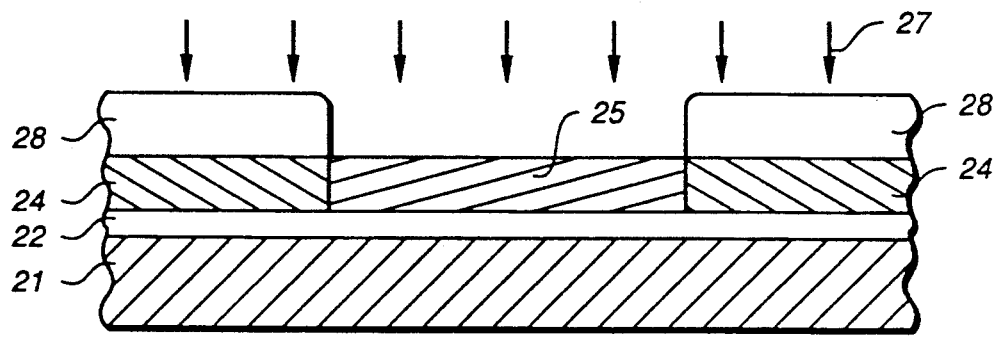
FIG._6B
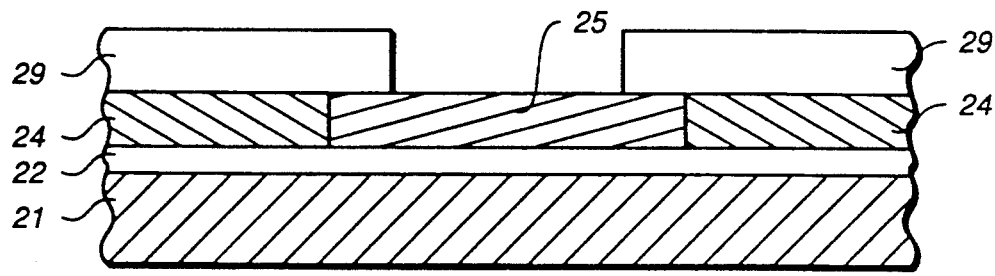
FIG._6C
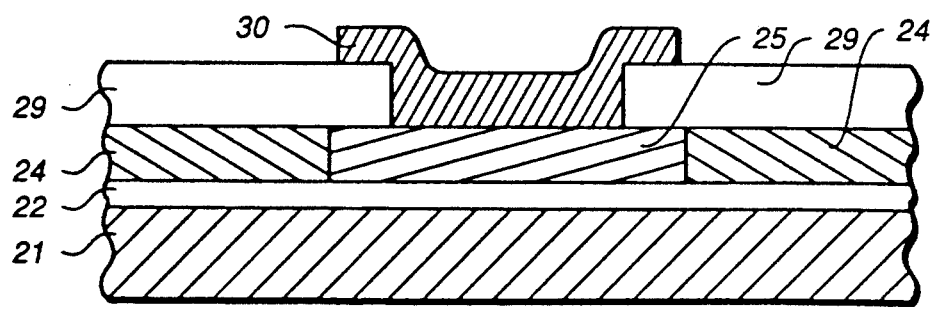
FIG._6D

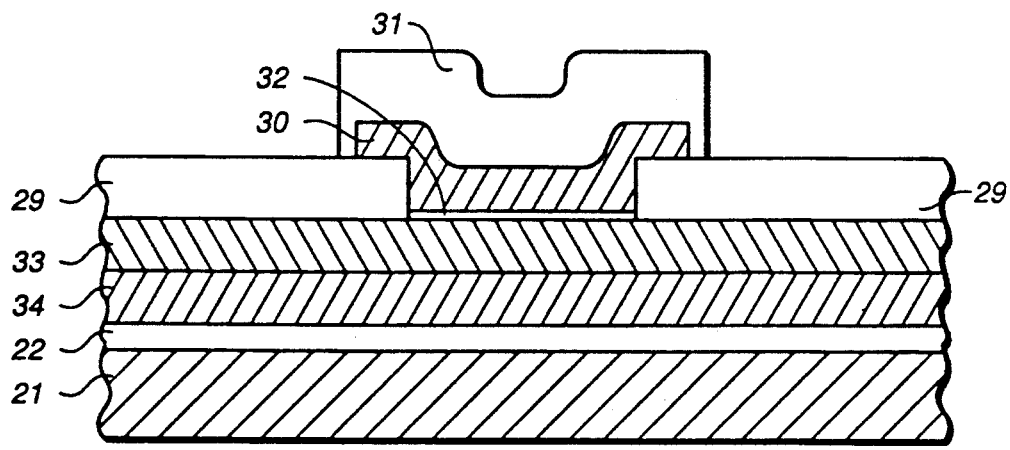
FIG._7
(PRIOR ART)
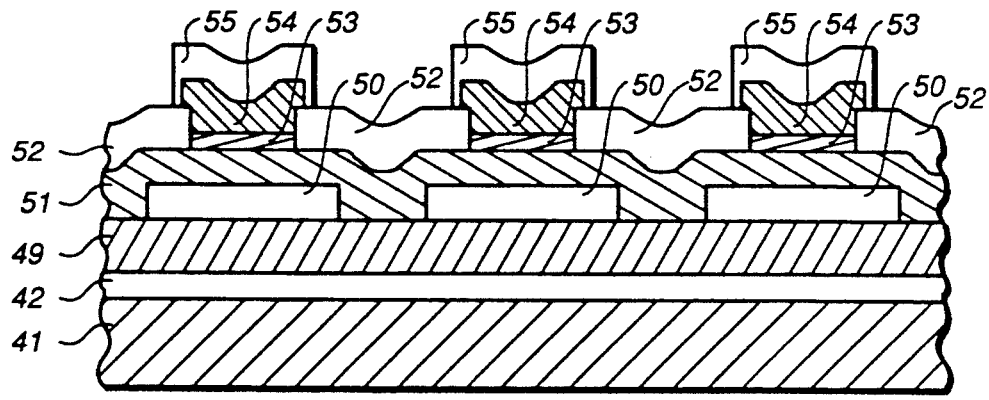
FIG._8
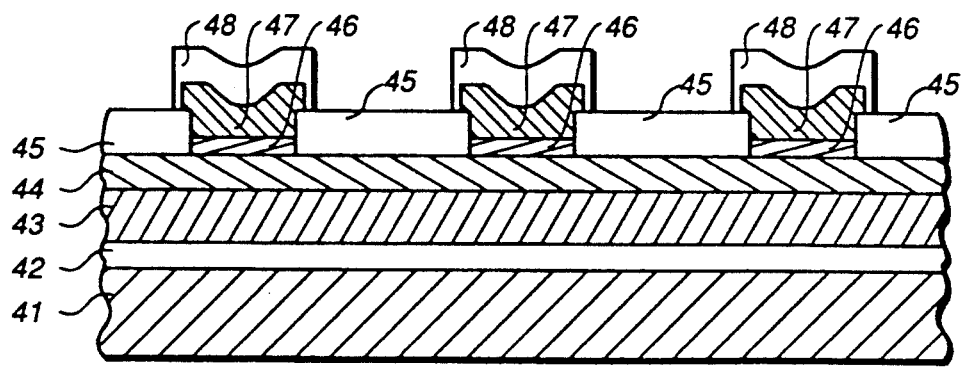
FIG._10
(PRIOR ART)

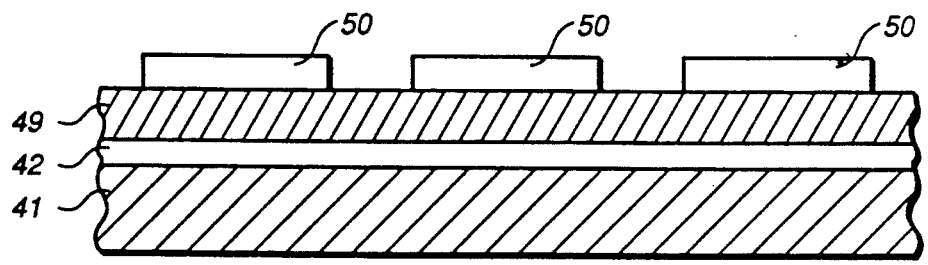
FIG._9A
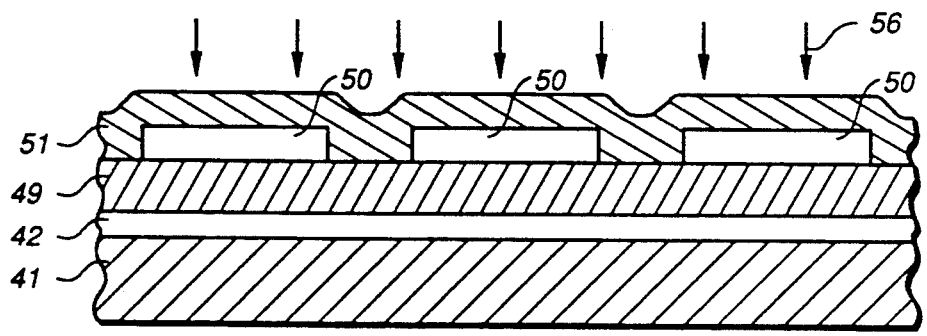
FIG._9B
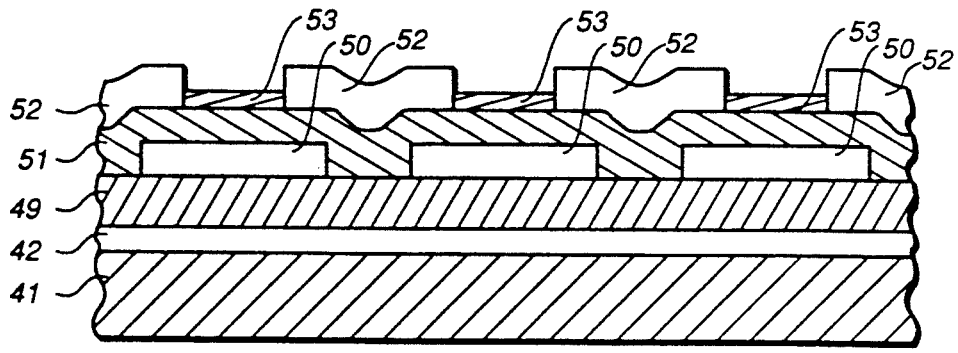
FIG._9C
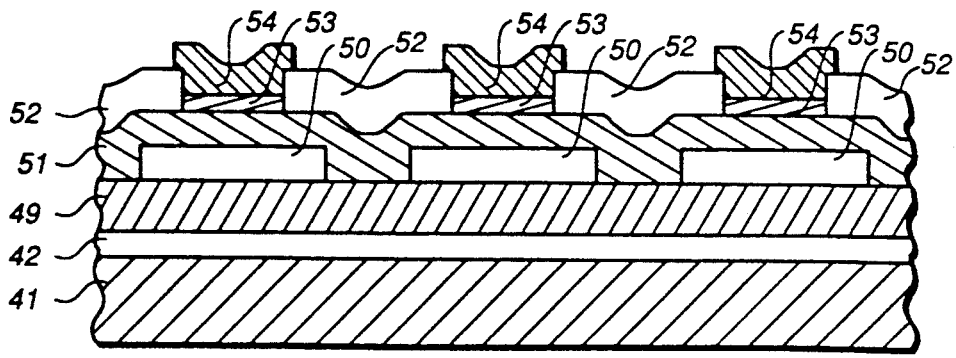
FIG._9D

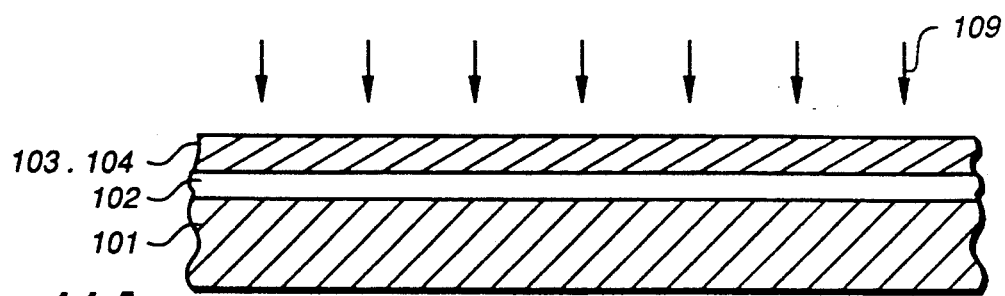
FIG._11A
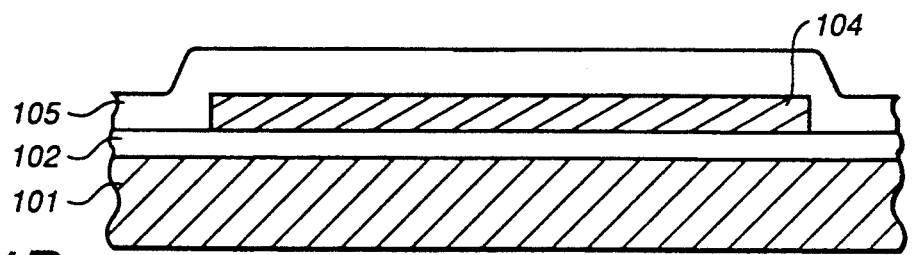
FIG._11B
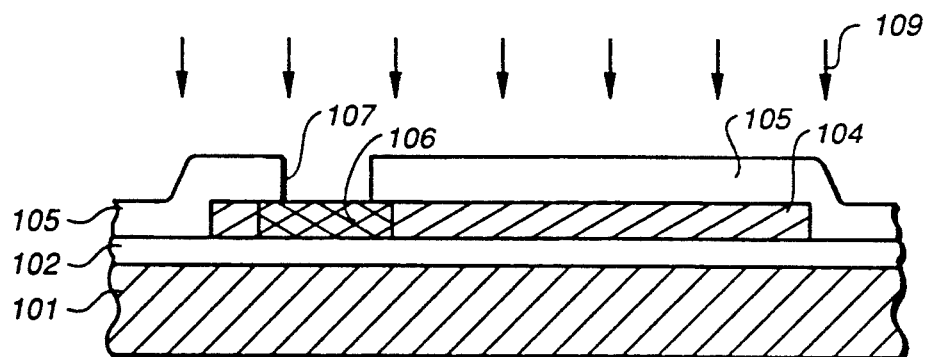
FIG._11C
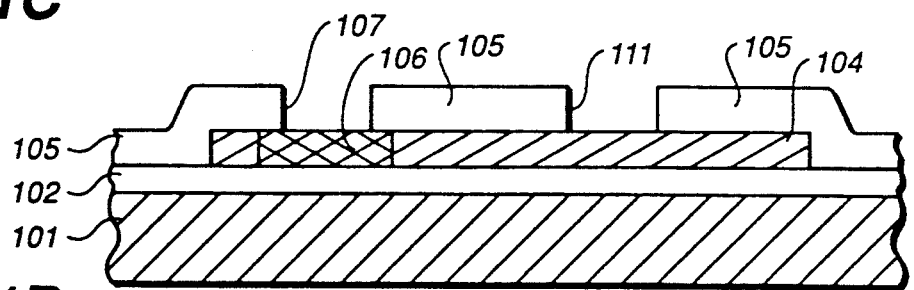
FIG._11D
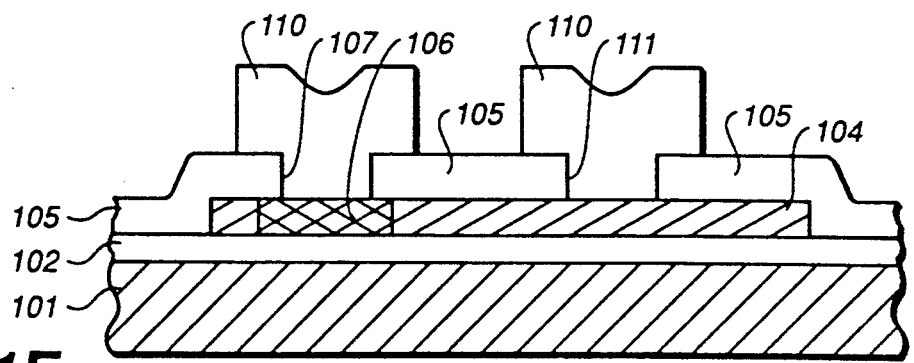
FIG._11E

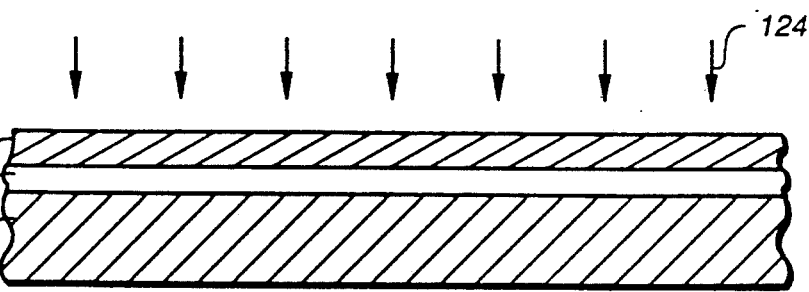
FIG._12A
(PRIOR ART)
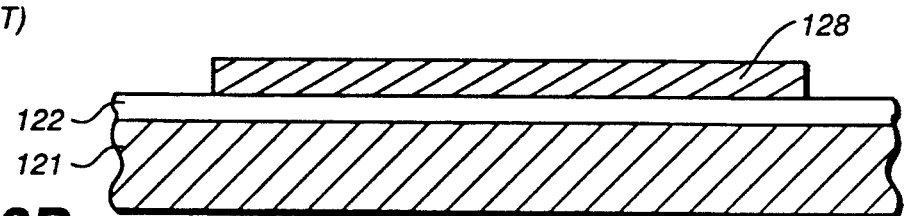
FIG._12B
(PRIOR ART)
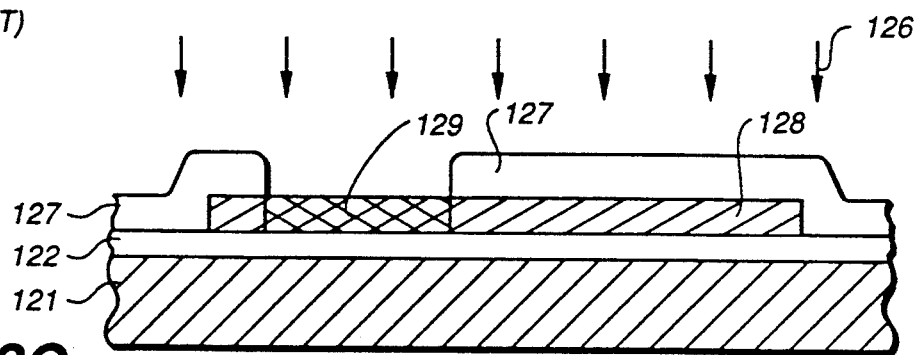
FIG._12C
(PRIOR ART)
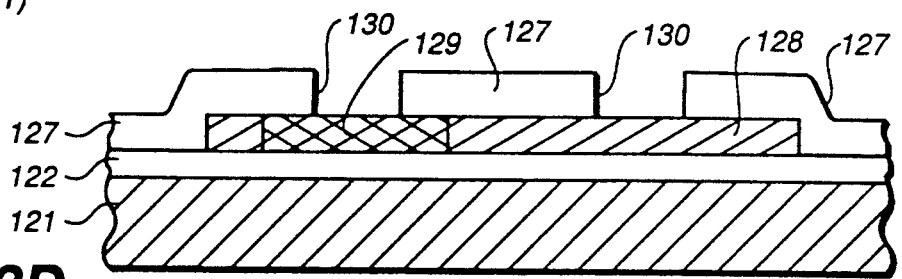
FIG._12D
(PRIOR ART)
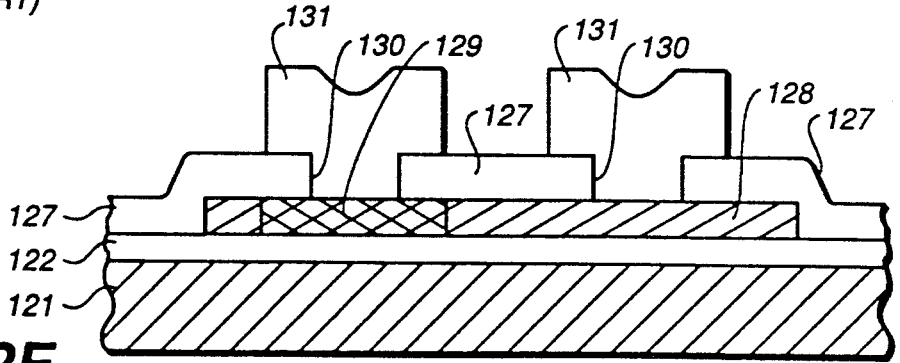
FIG._12E
(PRIOR ART)

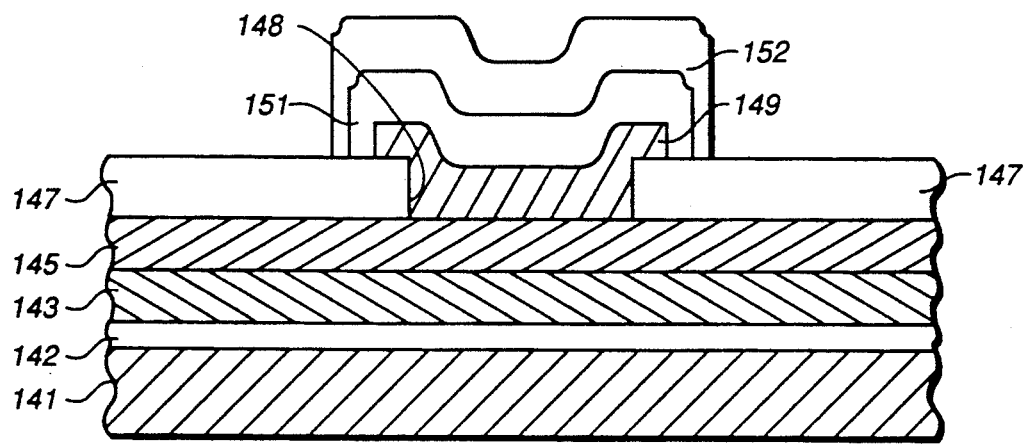
FIG._13
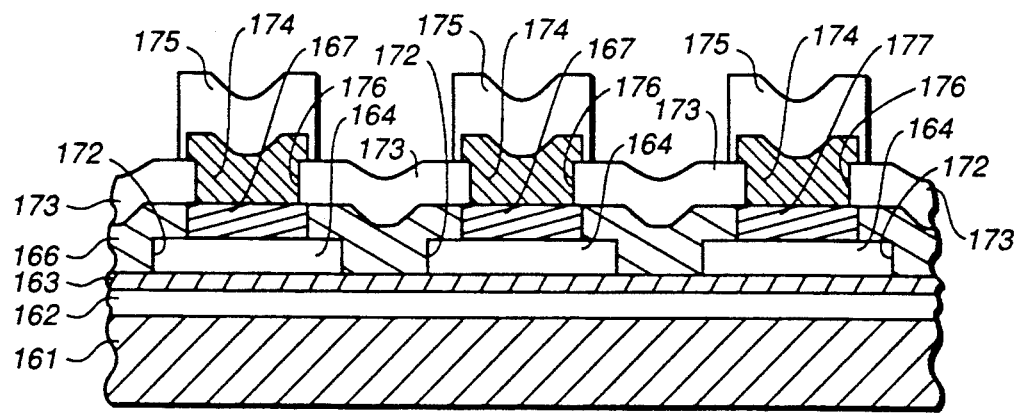
FIG._15
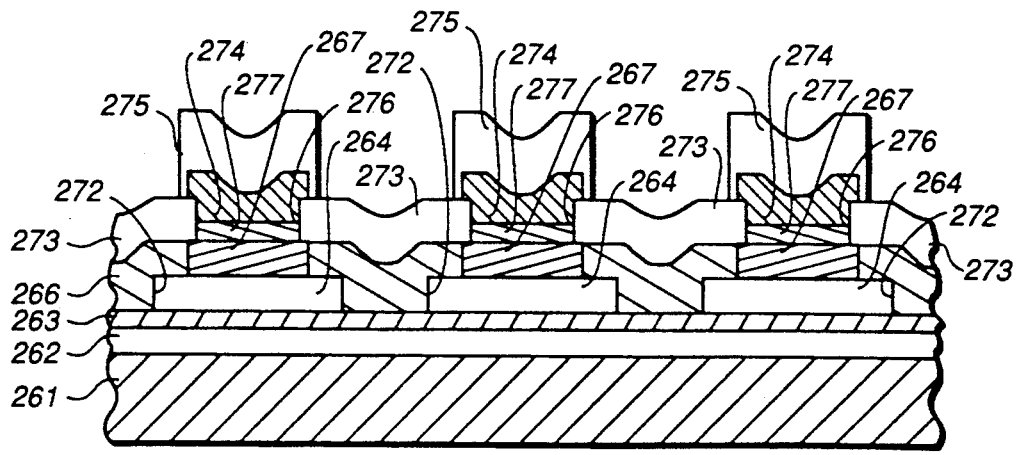
FIG._22

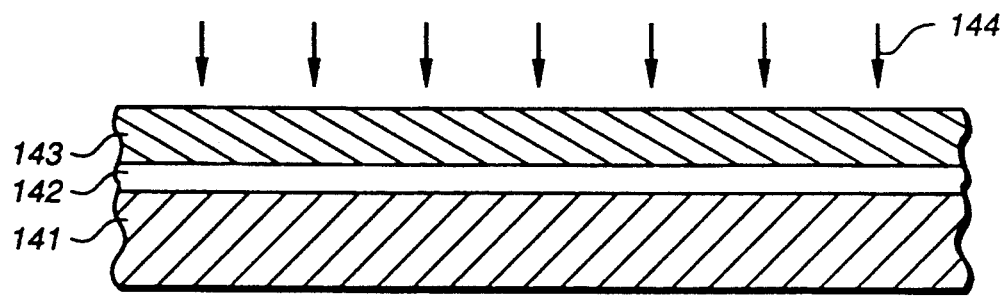
FIG._14A
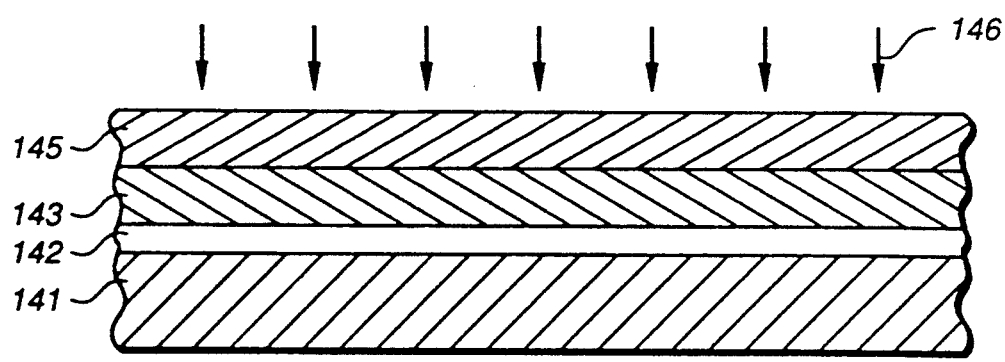
FIG._14B

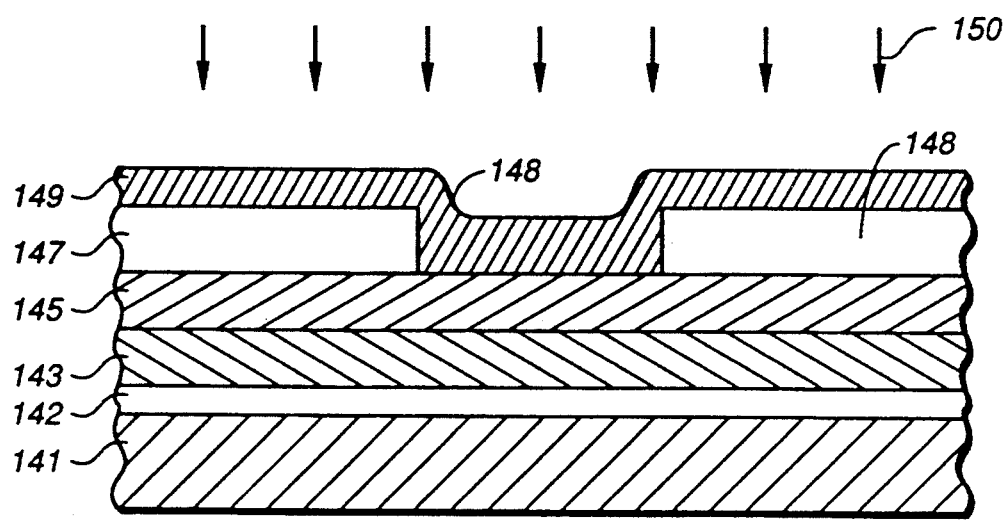
FIG._14C
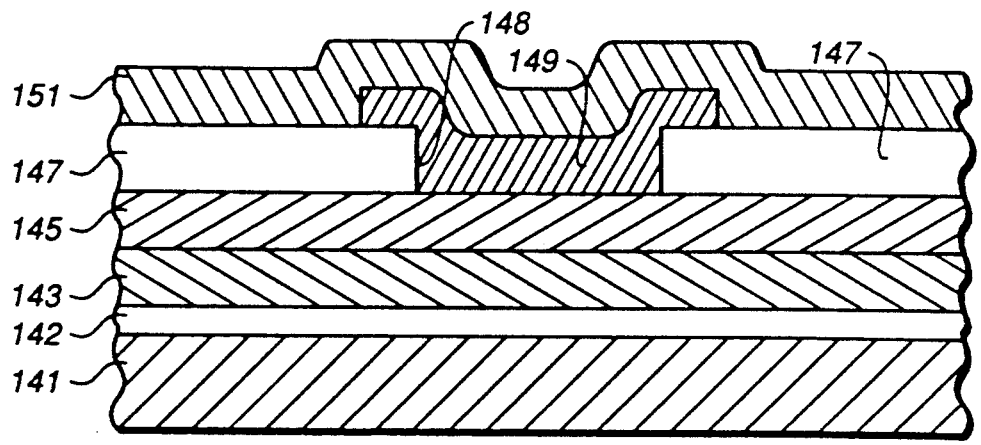
FIG._14D

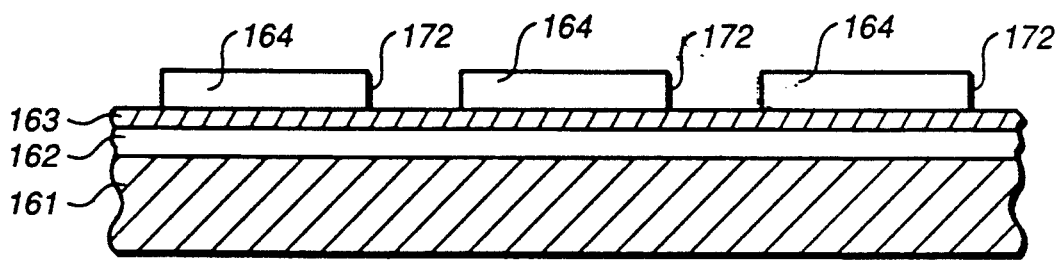
FIG._16A
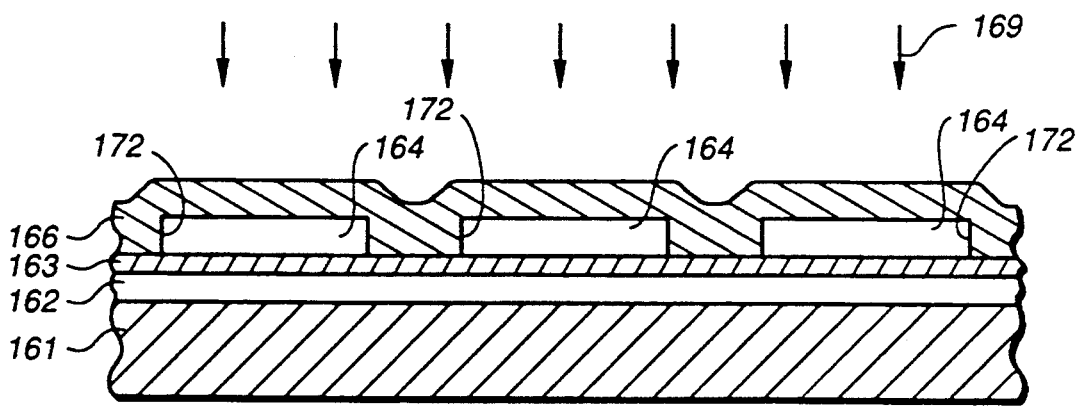
FIG._16B
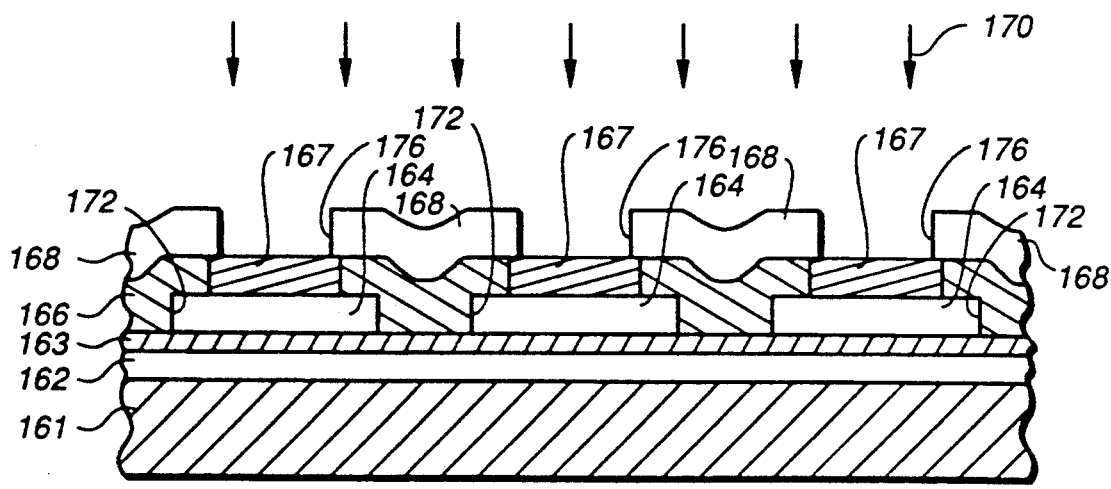
FIG._16C

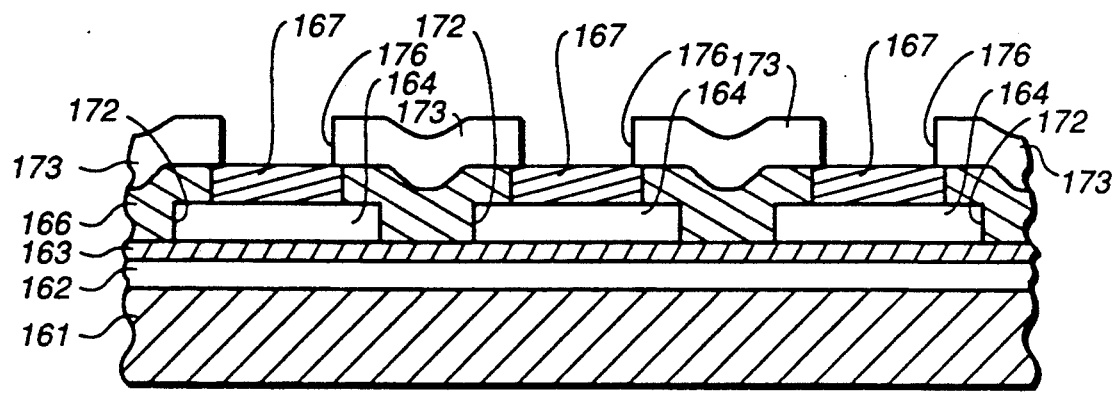
FIG._16D
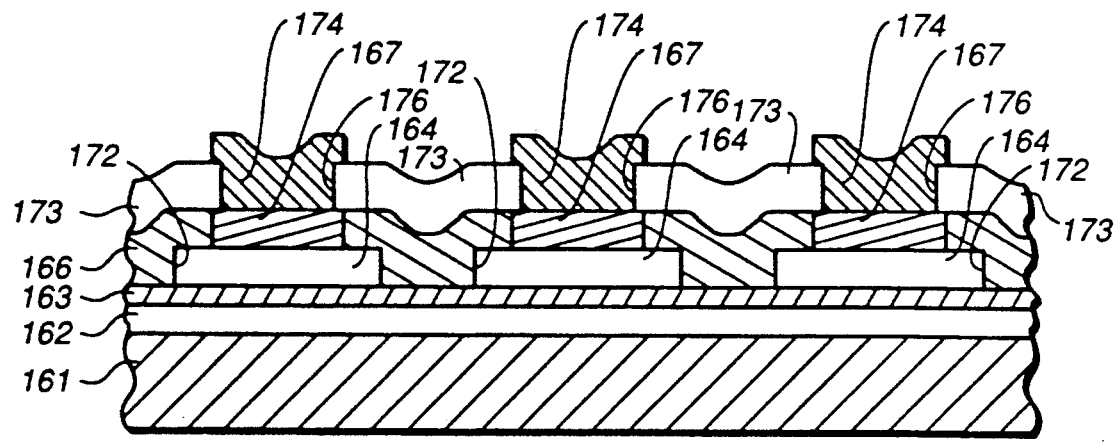
FIG._16E

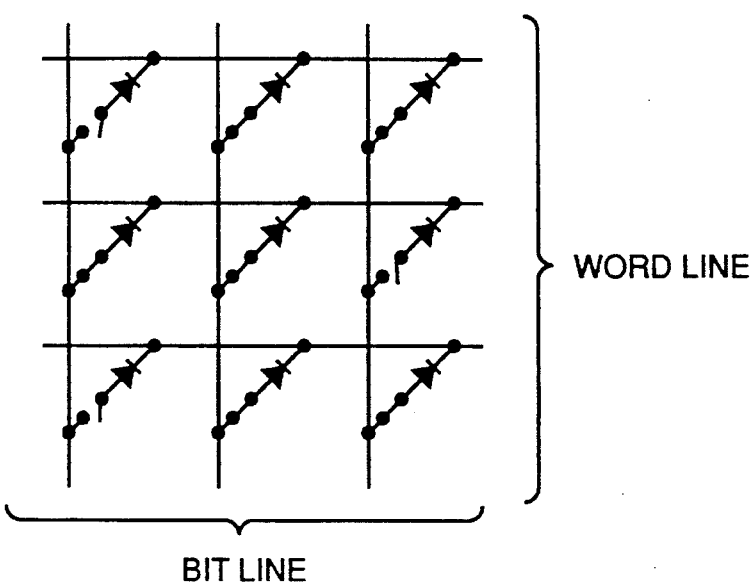
FIG._17A
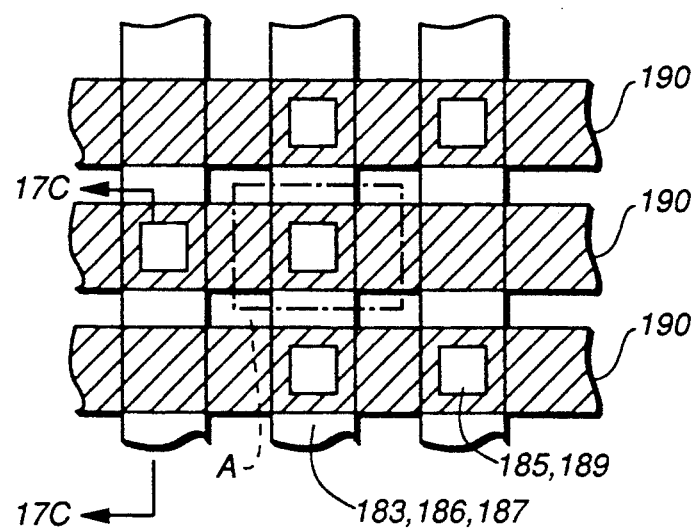
FIG._17B
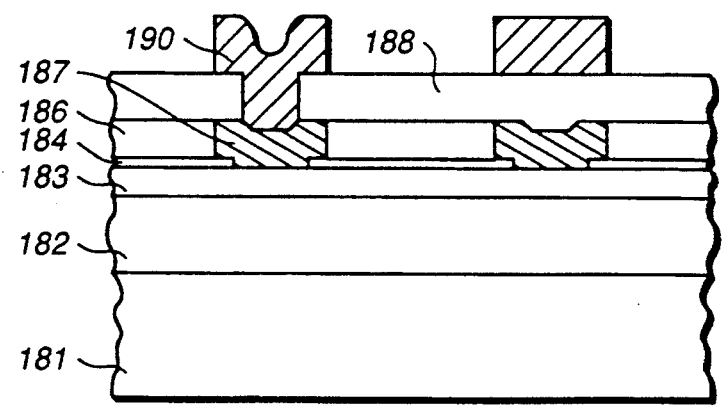
FIG._17C

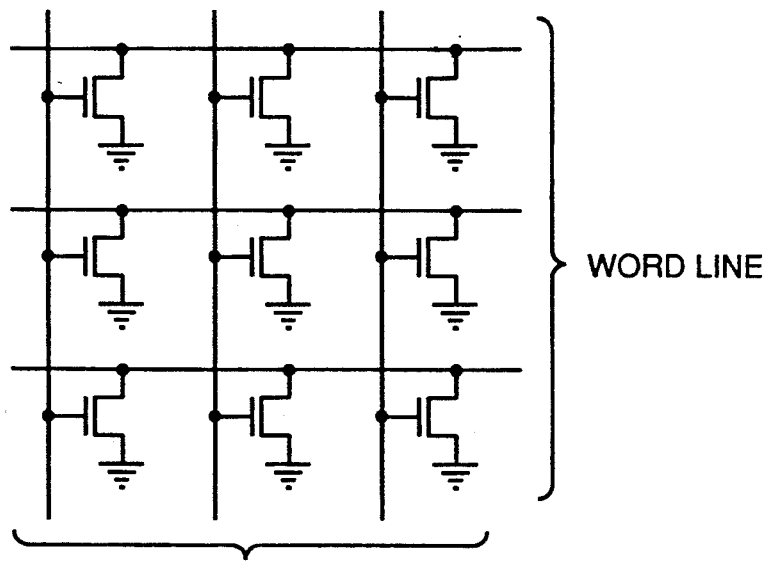
FIG._18A
*(PRIOR ART)*
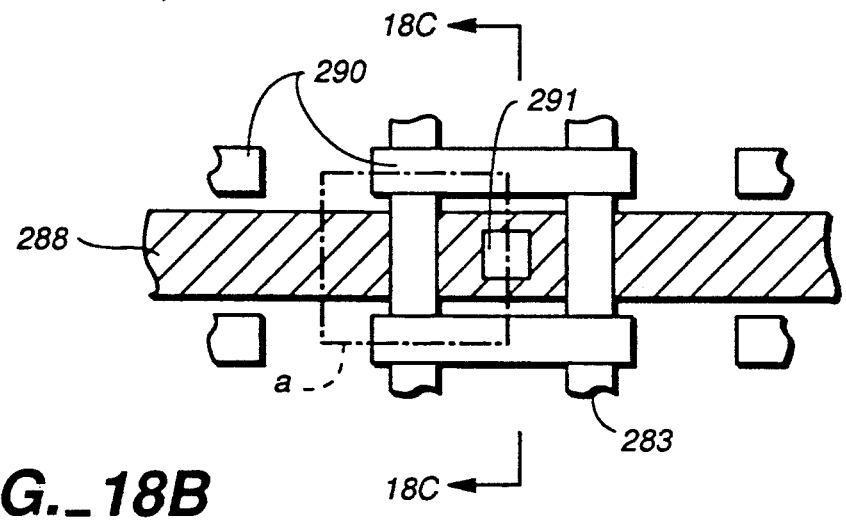
FIG._18B
*(PRIOR ART)*
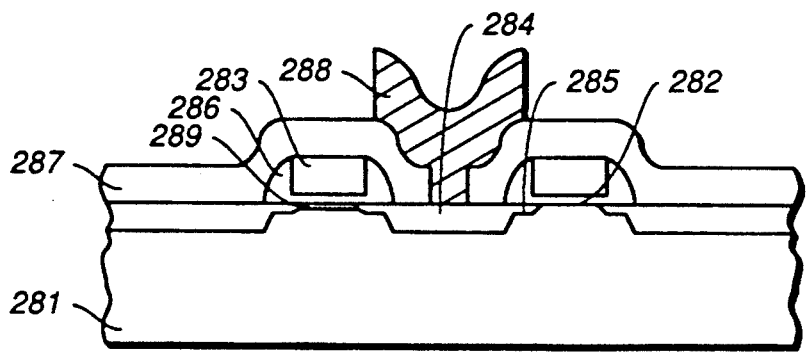
FIG._18C
*(PRIOR ART)*

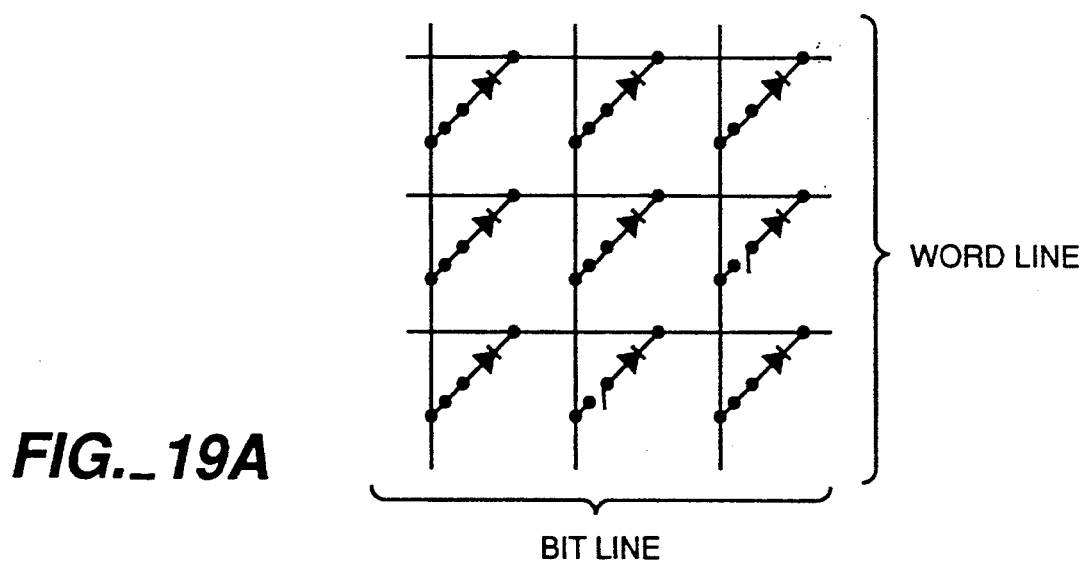
FIG._19A
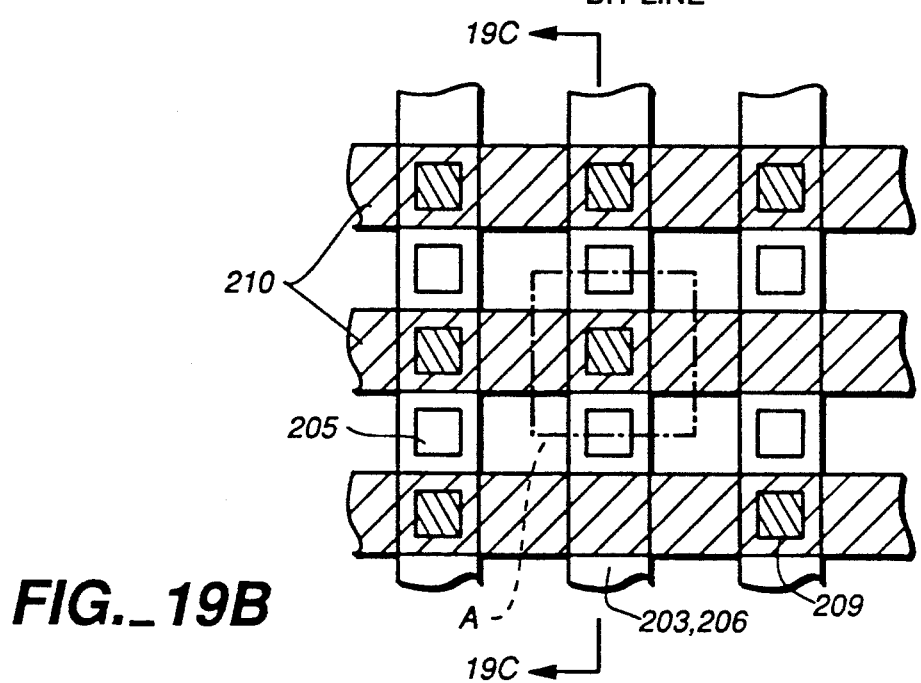
FIG._19B
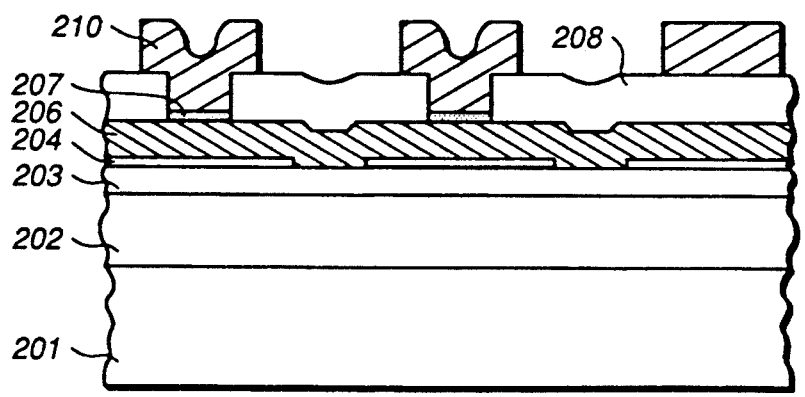
FIG._19C

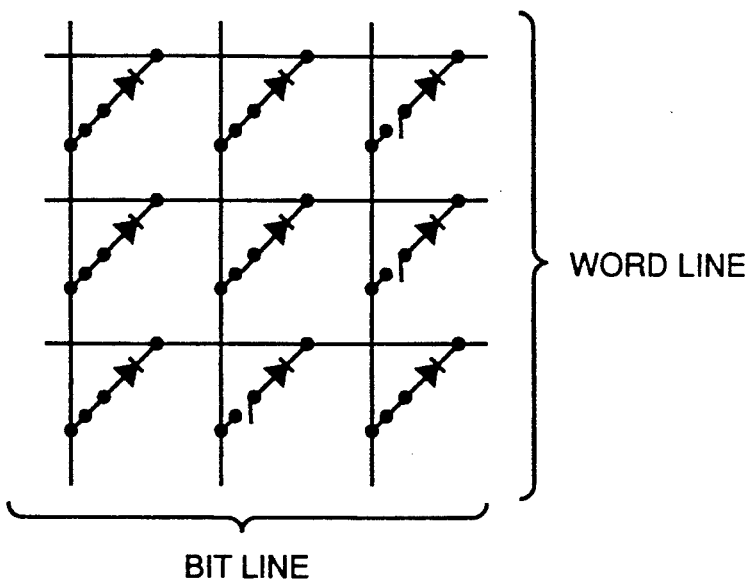
FIG._20A
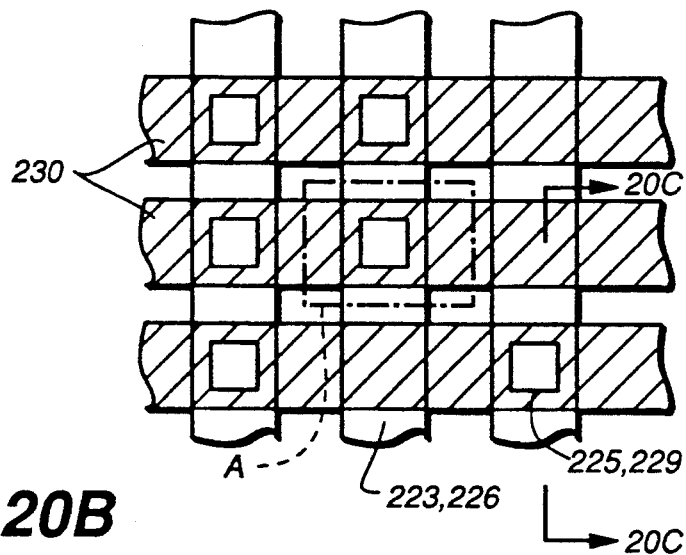
FIG._20B
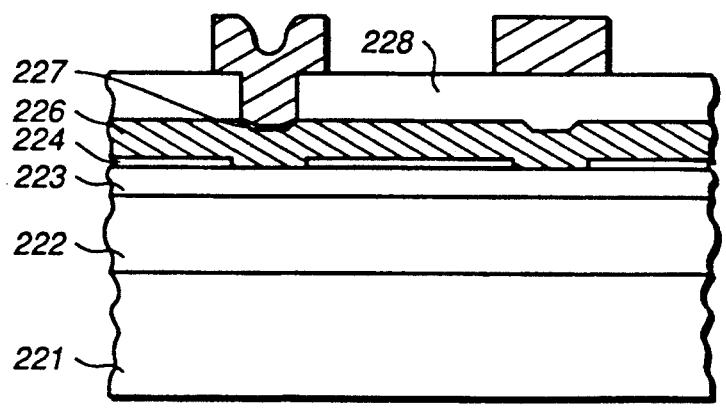
FIG._20C

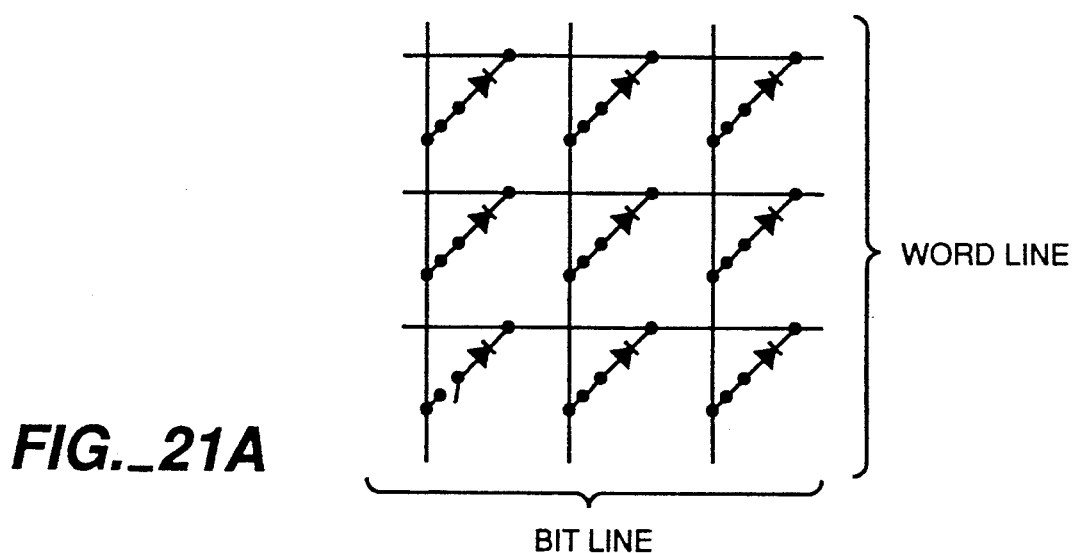
FIG._21A
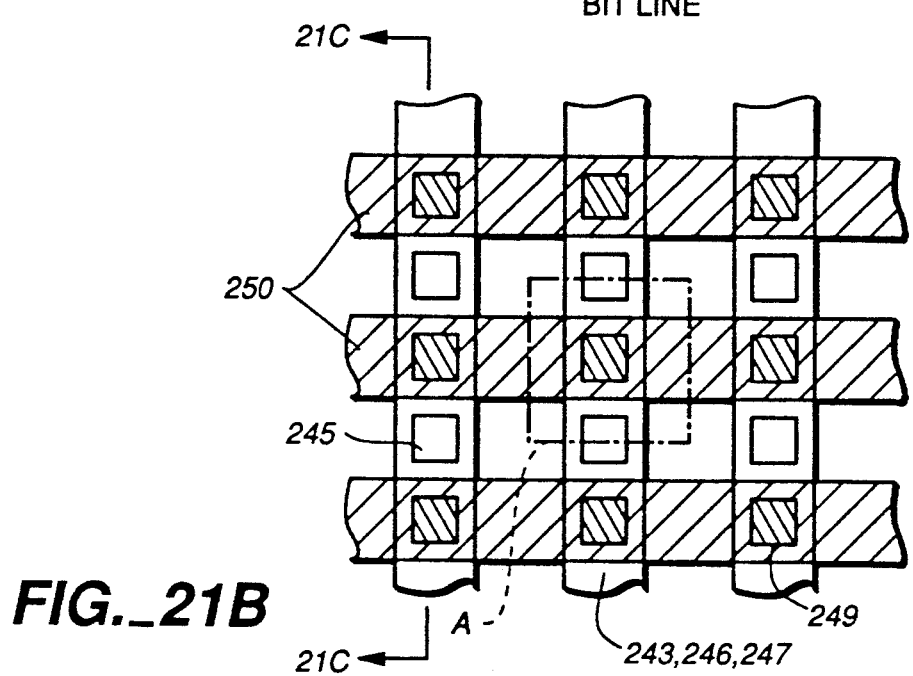
FIG._21B
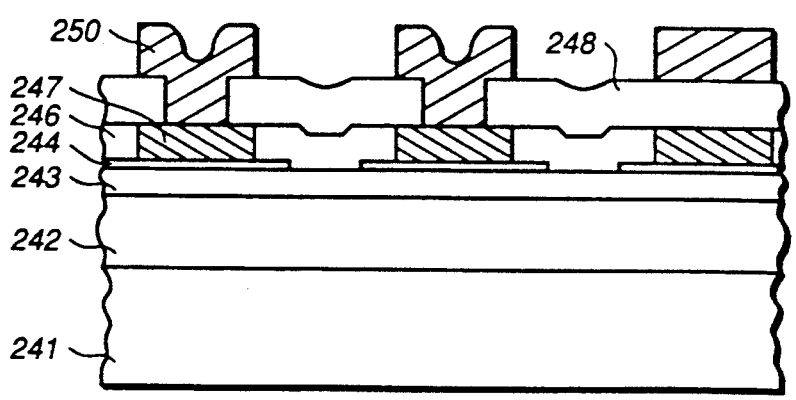
FIG._21C

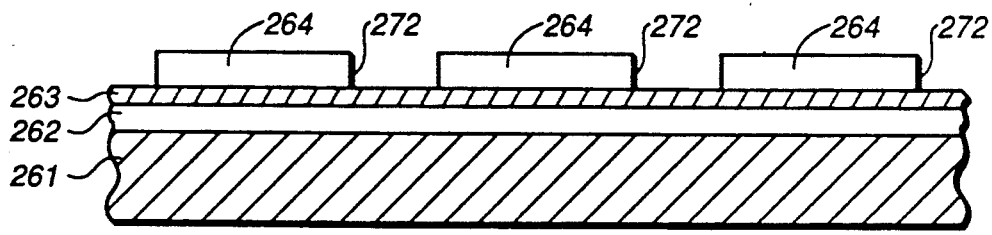
FIG._23A
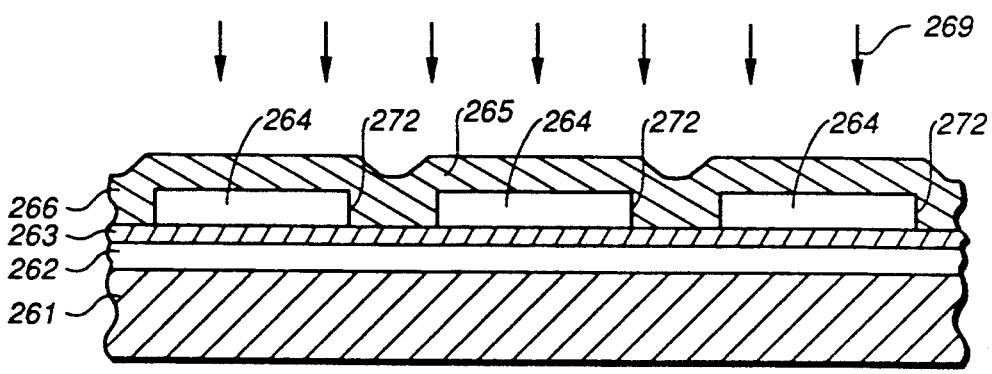
FIG._23B
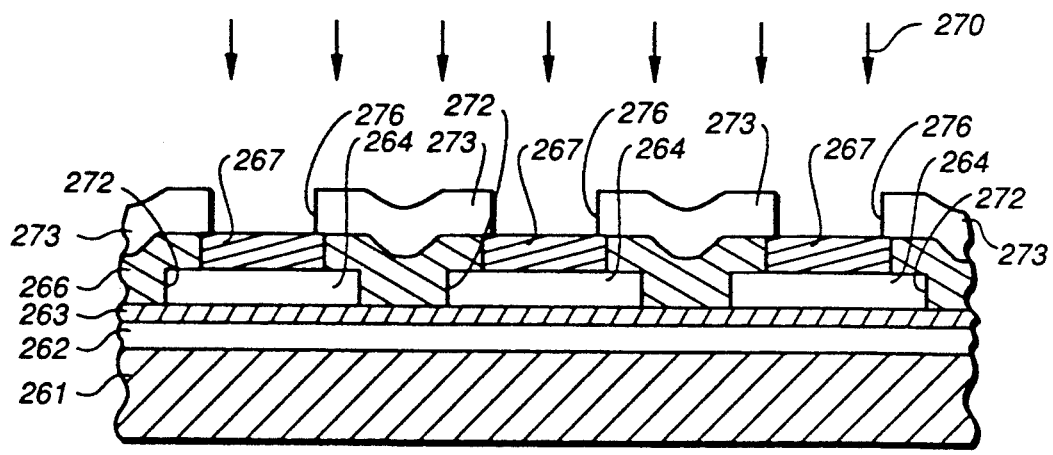
FIG._23C

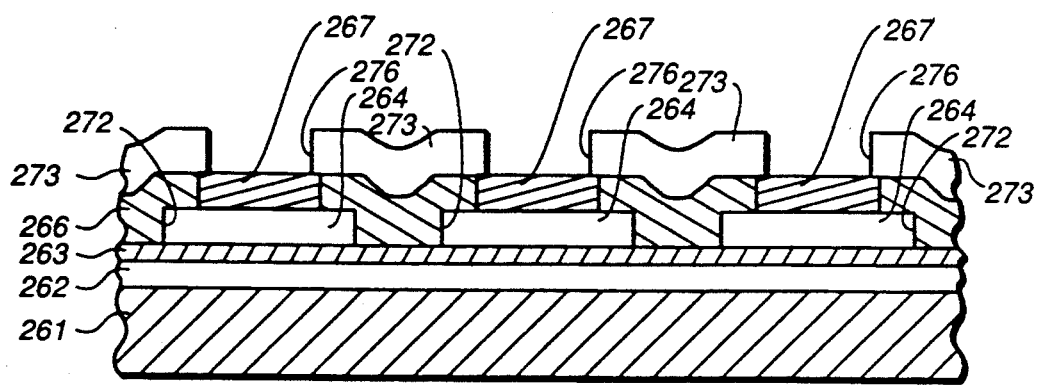
FIG._23D
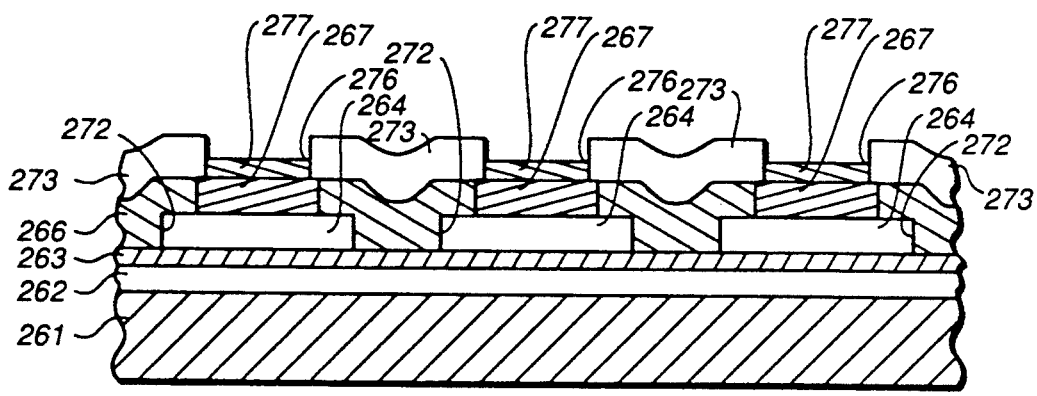
FIG._23E
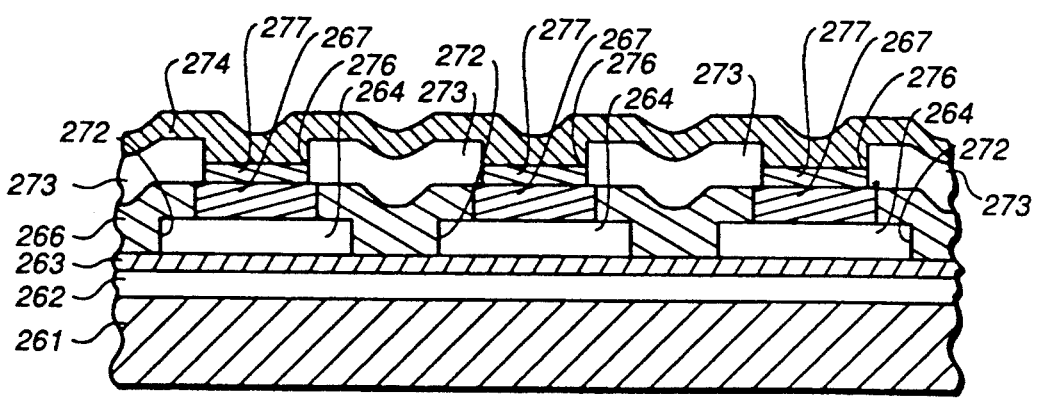
FIG._23F

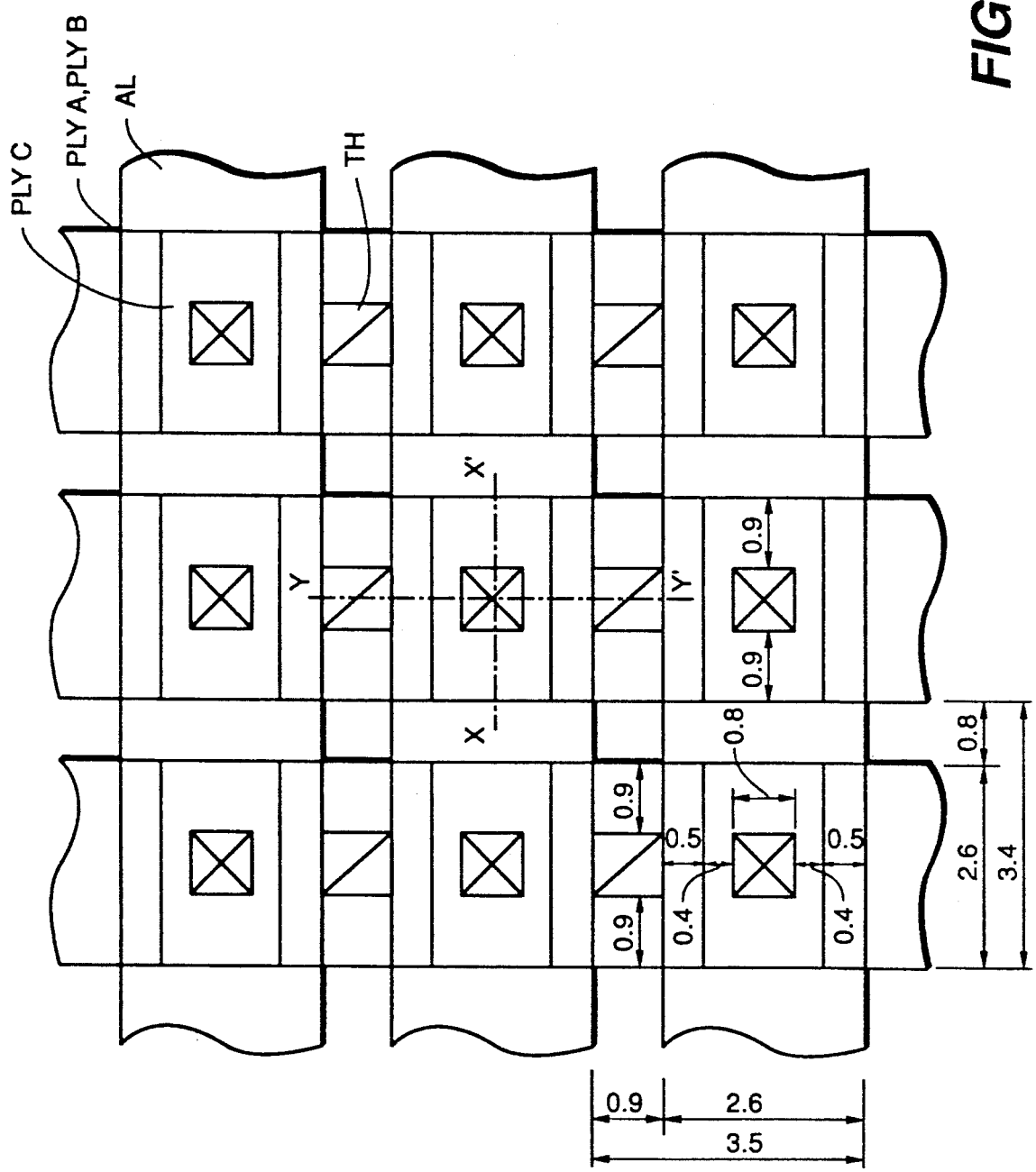
FIG._24

PROM AND ROM MEMORY CELLS

BACKGROUND OF THE INVENTION

This invention relates generally to semiconductor memory devices, and more specifically to read only memory ROM and antifuse-based programmable read only memory (PROM) cells having improved ON and OFF characteristics that allow advanced levels of microminiaturization. The invention especially relates to the concurrent fabrication of high quality isolation diodes and low resistance buried (lower) wiring layers used typically as bit lines in memory matrices.

Certain nonvolatile memories that incorporate Schottky barrier diodes are based on antifuse memory cells (elements that act opposite to fuses). The antifuse memory cells typically comprise an intrinsic silicon (defined as silicon with negligible impurities) film deposited over a Schottky barrier diode (see, FIG. 3). Such memory cells have a substrate 1, a first insulation layer 2, a polycrystalline silicon film (polysilicon layer) 5, a second insulation layer 7, a titanium layer 8, an intrinsic silicon film 9, and an aluminum interconnect 10. A Schottky barrier diode is created at the interface of the polysilicon layer 5 and the titanium layer 8 that is deposited on layer 5.

Individual memory cells are often arranged in matrices to get the smallest possible memory array size. FIG. 4 is an example of such a matrix. Each cell is equivalent to a programmable switch in series with an isolation diode. The data stored is represented by the switch either being ON and OFF. The diodes in FIG. 4 are Schottky barrier diodes. Silicon film 9 has a high resistance before being programmed. Such a condition in an antifuse cell is often spoke of as the OFF (unprogrammed) state. This is opposite to fuse link type PROMs where the fuses are blown open by programming to be in their OFF state. To program an antifuse memory cell, a voltage of about 20 volts is applied across silicon film 9, this causes a dielectric breakdown to occur with a resulting current flow that forms a conductive bridge (by a mechanism not fully understood by those skilled in the art).

Attempts to further microminiaturize antifuse memory cells of the prior art have encountered major structural problems. At very fine geometries, large variations in data read sensing currents occur due to the necessary arrangement of memory cells into a matrix. FIG. 3 is a prior art antifuse memory cell comprised of a substrate 1, an insulating layer 2, a polysilicon layer 5 that serves double duty as a bit line interconnect, a second insulating layer 7, a refractory metal layer 8 that forms a Schottky barrier diode interface with polysilicon layer 5, an intrinsic silicon layer 9 that is so pure it functions as an insulator until a programming voltage is applied and changes its structure, and an aluminum metalization 10 that serves as a word line interconnect. FIG. 4 shows sixteen memory cells positioned at the intersections of four bit lines and four word lines. As mentioned, the bit lines (vertical lines in FIG. 4) are typically made of the n-polysilicon layer 5, and as such it needs to have high doping levels in order to be sufficiently conductive. But too high a level of doping will disable the Schottky barrier diode. The word line select lines (horizontal lines in FIG. 4) use the aluminum interconnect 10. Although the sheet resistance value of the aluminum is under 30 milli-ohms/square, the sheet resistance of silicon with a high impurity level that is still low enough to be compatible with a Schottky barrier diode is very high, usually over 1,000 $\Omega$/square. Higher levels of impurities (over $1 \times 10^{22}$ cm$^{-3}$) can be injected to lower the resistance value to about 100 $\Omega$/square. But the diffusion current (the reverse biased current in the Schottky barrier diode) gets too high, and the diode ceases to effectively isolate the memory cells from one another. The parasitic resistance values also vary greatly as a function of the positions of the cells from the current sensing circuit. Even cells programmed the same way will show great differences in sense current if one cell is close to and the other cell is relatively far from the current sensing circuit. This complicates programmed data sensing and makes data reading difficult.

Further variability in read sensing currents also stems from the fact that the greater the current during programming of a memory cell, the lower an ON resistance that cell will have during reading. The farthest out cells receive the least amount of programming current and return the least amount of read current for two reasons. The first was just mentioned and the second is that the read sense bit line lines add their own resistance to the read current.

To combat this problem, the prior art has had to make the polysilicon lines wider, but this runs contrary to efforts to microminiaturize PROM memories beyond present day levels.

A prior art memory cell in FIG. 7 has a substrate 21, a first insulation layer 22, a lower layer wiring 34 (e.g., polycrystalline silicon film containing a high impurity concentration), a semiconductor film 33 (e.g., polycrystalline film containing impurity on the order of $1 \times 10^{17}$ atoms per cm$^{-3}$), a second insulation film 29, a metal film 32, e.g., titanium or platinum, an intrinsic silicon film 30 (e.g., impurity-free polycrystalline film), and a wiring layer 31 (e.g., aluminum film). The intrinsic silicon film 30 is formed on top of what constitutes a Schottky barrier diode. The diode comprises metal film 32 and semiconductor film 33. When programmed, the memory cell will connect wiring layer 31 through film 30 to the metal 32 side of the Schottky diode. The intrinsic silicon film 30 acts as an insulator before programming. Programming applies a voltage of about 20 V across the intrinsic silicon film, a dielectric breakdown occurs in the intrinsic silicon film and current flows causing structural changes that permanently short across layer 10.

In the prior art there are problems that occur during heat treatment. Impurities from (for example FIG. 7) layer 34 can migrate into the semiconductor film 33, which is part of a Schottky barrier diode, that causes deterioration in the performance of the Schottky barrier diode. A conventional way to further microminiaturize a memory cell has been to make the lower layer wiring 34 a silicon film have a high concentration impurity (over $1 \times 10^{21}$ atoms per cm$^{-3}$). Silicon film can be made very thin. Semiconductor film 33 is injected with a small amount of impurity. Heat treatment is used to activate the impurities. At this point, impurities in the lower layer wiring 34 will surge into the semiconductor film 33 during programming, and will end up in the metal film 32. The distance between layer wiring 34 and the metal film 32 (the film thickness of the semiconductor film 33) is very small. An acceptable concentration of impurities (such as phosphorus, boron, or arsenic) for semiconductor film 33 is $1 \times 10^{20}$ atoms per cm$^{-3}$. If the concentration gets too high, there is a problem with reverse current (diffusion current) in the Schottky barrier diode that gets too high. Experiments have shown that the difference in absolute values of the ON current and OFF current are as much as six orders of magnitude. But, if impurities are allowed to get to the metal film, the figure drops to less than one order of magnitude. When such a cell is fabricated as an antifuse-based PROM cell, current from other memory cells cannot be isolated.

Another prior art memory device is illustrated in FIG. 10, and it comprises a substrate 41, a first insulation layer 42, a lower layer wiring layer 43 (e.g., polycrystalline silicon containing impurity in high concentration), a semiconductor film 44 (e.g., polycrystalline silicon containing impurity on the order of $1 \times 10^{17}$ atoms per $cm^{-3}$), a second insulation film 45, a metal film 46 (e.g., titanium or platinum), an intrinsic silicon film 47 (e.g., a polycrystalline silicon film that does not contain impurities), and a wiring layer 48 (e.g., aluminum film). Much of the structure has been described above. But FIG. 10 shows a sectional view of three cells.

FIG. 12A to FIG. 12E show a prior art method of manufacturing a memory cell. In FIG. 12A, a first insulation layer 122 of $SiO_2$ film is deposited 3,000 Å thick on a substrate 121 with a chemical vapor deposition (CVD) method or a hot oxidation method in an oxygen atmosphere. A silicon film 123 is next deposited 5,000 Å thick with a CVD method leaving a polycrystalline silicon film by pyrolyzing monosilane gas at a temperature of about 620° C. Then a group V element (for example phosphorus or arsenic) is injected to make n-type region 128. A conventional ion driving method is used. The dose amount should be about $1 \times 10^{14}$ atoms per $cm^{-2}$. In FIG. 12B, the unnecessary parts of silicon film 123 are removed by a conventional photo-etching method. In FIG. 12C, a resist mask 125 is formed outside the area of where a p-type region 129 will be. A group III element (boron for example) is then injected, driven by a conventional ion driving method, with a dosage level higher than the dosage level for the group V element, about $1 \times 10^{15}$ atoms per $cm^{-2}$. Therefore, the n-type region 128 is eliminated to make p-type region 129. In FIG. 12D, the resist mask 125 is removed, and a second insulation layer 127 of $SiO_2$ film is deposited 2,000 Å thick using a CVD method. A heat treatment follows to activate the group V and group III impurities. Annealing is preferably then done at 1,000° C. for one minute in a nitrogen atmosphere using a halogen lamp. Next, contact holes 130 are positioned in the second insulation layer 127 in n-type region 128 and p-type region 129 using a photo-etching method. In FIG. 12E, aluminum is deposited with a sputtering method to produce a wiring layer 131 on top of the second insulation layer 127 and contact holes 130. Unnecessary portions of layer 131 are removed with a photo-etching method. A P-N junction diode is thus constructed at the interface of regions 128 and 129.

A few prior art read only memory (ROM) devices are programmed by an ion injection method to change the value of the threshold voltage of single transistor cells, like the one shown in FIG. 18A. (See, Y. Shacham-Diamand, et al., "A NOVEL ION-IMPLANTED AMORPHOUS SILICON PROGRAMMABLE ELEMENT", IEDM 87, pp. 194-197.) In FIG. 18B, such a device comprises a substrate 281, a gate film 282, a gate electrode 283, a high concentration diffusion layer 284, an LDD-type low concentration diffusion layer 285, an LDD-type side wall insulation film 286, an interlayer insulation film 287, and an aluminum wiring layer 288. Here the ROM data write-in is done by forming impurity layer 289 by ion injection before or after forming interlayer insulation film 287 to change the threshold voltage. Also, FIG. 18C is a plan view, where "A" is a single memory cell unit and space 290 is an element separation gap.

The commercial pressures on technology to make memories more dense have come to the point where a memory cell (such as in FIG. 18) consists of a single transistor contacted at its gate electrode by aluminum interconnect 288. But high speeds have not been possible because the ON resistance of the transistor itself does not proportionally drop when scaling down the overall device size.

The present invention solves the above problems, in at least one embodiment it does so by separating the Schottky diode construction from the material used to interconnect the memory cells in read sense columns. The vertical bit line lines can be heavily doped and thus can be highly conductive, even at very fine line widths.

SUMMARY OF THE INVENTION

An object of the present invention is to provide an antifuse-based PROM that avoids having to compromise between low enough polysilicon doping levels to have acceptable diode diffusion currents and high enough polysilicon doping levels to have adequate conductivity for the bit line interconnects.

Another object of the present invention is to provide an antifuse-based PROM that has a narrower range of ON currents and a narrower range of OFF currents and a wider separation between ON and OFF currents in the memory cells contained within a matrix inside the PROM.

Another object of the present invention is to provide a ROM that has improved isolation diodes and that is easy to process through the final mask that contains the data to be stored.

Briefly, one embodiment of the present invention comprises an antifuse memory cell having a P+ polysilicon doping in a region directly under an intrinsic silicon programming layer. The P+ polysilicon region is surrounded by an N− polysilicon doped region, and the two regions are sandwiched between layers of silicon dioxide insulation. The interface between the two regions is a P-N junction, in fact, a diode. The diode does not suffer from a diffusion current that increases with increasing levels of N− doping, therefore the N− polysilicon can be heavily doped to yield a very conductive bit line interconnect for a memory matrix. The interconnect line widths can be very narrow, and further microminiaturization is aided thereby. The top metalization is aluminum and serves as a word line interconnect in the memory matrix.

An advantage of the present invention is that impurities in lower layer wiring layers do not migrate as far as the Schottky barrier diodes, even after heat processing. Schottky barrier diodes having good electric properties are possible without inviting increased reverse currents (diffusion current).

A further advantage of the present invention is that an antifuse-based PROM with a large difference between ON and the OFF currents is possible, and reliability will thereby be improved.

A further advantage of the present invention is that a method of manufacturing is provided such that p-type impurities are injected from through a contact hole. There is no need for a junction surplus between the contact hole and the p-type impurity region, and it is possible to make a miniaturized silicon thin film P-N junction diode instead.

A further advantage of the present invention is that both p-type and n-type regions in a semiconductor film can have an intrinsic silicon film formed over either of them, and yet both exhibit widely separate ON and OFF current characteristics. A sensing margin of safety for the current sensing current improves accuracy. It is therefore possible to control manufacturing variations while in mass production.

A further advantage of the present invention is that fewer processing steps are needed and manufacturing is simplified.

A further advantage of the present invention is high integration, faster operation and a shortened delivery time are made possible by using diodes in memory cells that replace transistors.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 1 is a cross-sectional view of an antifuse-based PROM memory cell which is a first embodiment of the present invention;

FIGS. 2A-D are cross-sectional diagrams of the memory cell of FIG. 1 shown in various stages during its fabrication.

FIG. 3 is a cross-sectional view of a prior art antifuse-based PROM memory cell;

FIG. 4 is a schematic diagram of a typical memory matrix within a PROM and shows the antifuse programming layer of each memory cell represented by a switch at the cross junctions of the several bit line and word line interconnect lines. The corresponding isolation diodes are shown in series with each open switch. Since all switches are shown open, FIG. 4 illustrates a PROM that has not yet been programmed.

FIG. 5 is a cross-sectional view of an antifuse-based PROM memory cell which is a second embodiment of the present invention;

FIGS. 6A-D are cross-sectional diagrams of the memory cell of FIG. 5 shown in various stages during its fabrication.

FIG. 7 is a cross-sectional view of a prior art antifuse-based PROM memory cell;

FIG. 8 is a cross-sectional view of an antifuse-based PROM memory cell which is a third embodiment of the present invention.

FIGS. 9A-D are cross-sectional diagrams of the memory cell of FIG. 8 shown in various stages during its fabrication;

FIG. 10 is a cross-sectional view of a prior art antifuse-based PROM memory cell.

FIG. 11A-E are cross-sectional diagrams an antifuse-based PROM memory cell which illustrate a fourth embodiment of the present invention showing the various stages of fabrication;

FIGS. 12A-E are cross-sectional diagrams a prior art antifuse-based PROM memory cell which compares with the fourth embodiment of the present invention (FIG. 11) showing the various stages of fabrication;

FIG. 13 is a cross-sectional view of an antifuse-based PROM memory cell which is a fifth embodiment of the present invention;

FIGS. 14A-D are cross-sectional diagrams of the memory cell of FIG. 13 shown in various stages during its fabrication;

FIG. 15 is a cross-sectional view of an antifuse-based PROM memory cell which is a sixth embodiment of the present invention;

FIGS. 16A-E are cross-sectional diagrams of the memory cell of FIG. 15 shown in various stages during its fabrication;

FIG. 17A is a partial schematic of a memory cell matrix where some antifuses (shown symbolically as switches) are ON and some are OFF. The bit line lines are "Bit Line" and the rows are "Word Line". FIG. 17B is a top elevational view of an antifuse memory cell which is a seventh embodiment of the present invention and the surrounding structures. FIG. 17C is a cross-sectional view of the memory cell of FIG. 17B taken along the line 17C—17C;

FIGS. 18A is a partial schematic of a prior art memory cell matrix where transistors are used to pull the word lines to ground when the bit lines are enabled. FIG. 18B is a top elevational view of a prior art antifuse memory cell and surrounding structures. FIG. 18C is a cross-sectional view of the memory cell of FIG. 18B taken along the line 18C—18C. The threshold voltages of the various transistors in FIG. 18A have been manipulated to represent permanently stored data;

FIG. 19A is a partial schematic of a memory cell matrix where some antifuses (shown symbolically as switches) are ON and some are OFF. The bit line lines are "Bit Line" and the rows are "Word Line". FIG. 19B is a top elevational view of an antifuse memory cell which is a eighth embodiment of the present invention and the surrounding structures. FIG. 19C is a cross-sectional view of the memory cell of FIG. 19B taken along the line 19C—19C;

FIG. 20A is a partial schematic of a memory cell matrix where some antifuses (shown symbolically as switches) are ON and some are OFF. The bit line lines are "Bit Line" and the rows are "Word Line". FIG. 20B is a top elevational view of an antifuse memory cell which is a ninth embodiment of the present invention and the surrounding structures. FIG. 20C is a cross-sectional view of the memory cell of FIG. 20B taken along the line 20C—20C;

FIG. 21A is a partial schematic of a memory cell matrix where some antifuses (shown symbolically as switches) are ON and some are OFF. The bit line lines are "Bit Line" and the rows are "Word Line". FIG. 21B is a top elevational view of an antifuse memory cell which is a tenth embodiment of the present invention and the surrounding structures. FIG. 21C is a cross-sectional view of the memory cell of FIG. 21B taken along the line 21C—21C;

FIGS. 22 is a cross-sectional view of an antifuse-based PROM memory cell which is a eleventh embodiment of the present invention;

FIGS. 23A-F are cross-sectional diagrams of the memory cell of FIG. 22 shown in various stages during its fabrication; and FIG. 24 is a top elevational view of a memory cell of the present invention showing exemplary dimensions of the various structural features. The dimensions are typical, and are in microns.

DESCRIPTION OF THE PREFERRED EMBODIMENTS

First Embodiment—FIG. 1 shows a semiconductor memory device, which is a first embodiment of the present invention, comprised of a first insulation film 2 deposited on a substrate 1, a first polysilicon film 3 that has been injected with a group III or group V impurity element and deposited on first insulation layer 2, a second polysilicon film 5, a second insulation layer 7 is deposited on the second silicon film 5, a contact hole is opened in the second insulation layer 7, a metal film 8 is deposited in the contact hole on the second silicon film 5 where it has been exposed, an intrinsic silicon layer 9 that functions as an insulator before programming, and a wiring layer 10 is deposited over the second insulation layer 7 and intrinsic silicon layer 9. The first polysilicon film 3 is injected with an impurity element in a heavier concentration than the concentration injected into the first polysilicon film 5.

Elements in the following embodiments that share the same functions in the various figures are given the same element numbers.

FIGS. 2A-2D are cross-sectional views of the device of FIG. 1 during each of the principal stages of the manufacturing process. In FIG. 2A, first insulation layer 2 is deposited with a CVD method (chemical gas phase growing method) on substrate 1, about 2,000 Å thick and comprising $SiO_2$ film. Then about a 3,000 Å thickness of polycrystalline silicon film is deposited on the first insulation layer 2 by a CVD method, which can include conventional pyrolysis of monosilane gas. To lower the resistance of polysilicon film 3, an injection of more than $1 \times 10^{15}$ atoms per $cm^{-2}$ of, e.g., phosphorus, is used in an ion driving method. Arsenic may also be used, instead of the phosphorus. In FIG. 2B, second polycrystalline silicon film 5 is deposited 3,000 Å thick by the same method above used for first polycrystalline silicon film 3. Then, in order to make film 5 n-type polysilicon, phosphorus atoms (for example) are injected using an ion driving method. The dosage level of the ion driving method must be carefully determined, because it controls the properties of the Schottky barrier diode. It is necessary to have as little reverse current as possible, and as low a sheet resistance value as possible. A dosage ranging between $1 \times 10^{12}$ and $1 \times 10^{14}$ atoms per $cm^{-2}$ is acceptable. The device is then heated in a $N_2$ atmosphere to activate the impurities in polysilicon films 3 and 5. The heat is raised to 1,000° C. for about 60 seconds using a halogen lamp. In FIG. 2C, second insulation layer 7 is deposited as an interlayer insulation layer. Preferably $SiO_2$ film is deposited approximately 3,000 Å thick with a CVD method. The second insulation layer 7 is partially removed, in places where the Schottky barrier diode is to be located, by a photo-etching method. The etching involves hydrogen fluoride solution with an organic resist, (e.g., that conventionally used during manufacture of semiconductor devices). Titanium layer 8 is sputtered over the entire surface, and heated to 700° C. for about 60 seconds using a halogen lamp. At the places the second insulation layer 7 was removed, the titanium reacts with silicone film 5 to yield titanium silicide. The titanium that does not turn into titanium silicide is washed off with a solution of ammonia, water, and hydrogen peroxide. In FIG. 2D, intrinsic silicon film 9 is deposited in the same manner as the first polycrystalline silicon film 3 (and also second polycrystalline silicon film 5) to a thickness of 2,000 Å thick with a CVD method. Unnecessary portions are thereafter removed with a photo-etching method. Aluminum interconnect 10 is sputtered onto the second insulation layer 7 and intrinsic silicon film 9. Excess aluminum is removed with a photo-etching method, in a conventional manner. By forming a silicon film having a low resistance value under the silicon film of the Schottky barrier diode, the parasitic resistance voltage can be substantially lowered.

The difference in sensing currents after programming is much greater than in the prior art, and it becomes possible for the current sensing circuit to discriminate stored data more accurately. During programming, it is possible to have a large current flow which directly results in lower resistance values after breakdown. Since the impurities in the silicon film of the Schottky barrier diode can be set as desired, the output current can be optimized. Although the present example has described using titanium for metal film 8, other refractory metals, e.g., platinum or tungsten, can also be used. It is possible for low resistance silicon serve double duty, for example as a gate electrode of a transistor. Also it is possible to heavily dope the substrate, instead of the polycrystalline silicon film 3, to obtain the same effect above even though the second polycrystalline silicon film 5 is deposited above it.

Second Embodiment—FIG. 5 illustrates a second embodiment of the present invention. FIGS. 6A-6D show the principal stages of each of the manufacturing steps. A first insulation layer 22, preferably of silicon dioxide ($SiO_2$), is deposited 5,000 Å thick using a chemical vapor deposition (CVD) method (e.g., chemical gas phase growing method) on a substrate 21. Approximately 2,000 Å of a polycrystalline silicon (polysilicon) film 23 is deposited on first insulation layer 22, also by a CVD method, such as conventional pyrolysis of monosilane gas. An isolation diode is fabricated within polysilicon film 23 (FIG. 6A) starting with an n-type impurity (group V from the periodic table of elements) injected (arrows 26) into polysilicon film 23. Phosphorus, being such an impurity, is preferably injected at a dosage level of about $5 \times 10^{13}$ atoms per $cm^{-2}$, at energy of 40 Kev, using a conventional ion driving method. The area thus injected becomes an n-type region 24 belonging to the isolation diode. Next, a resist mask 28 (FIG. 6B) is deposited on a part of polysilicon film 23. In FIG. 6B, a p-type region 25 within polysilicon film 23 is deposited in areas left exposed by the resist mask 28. A p-type impurity, such as boron, from the group III elements, is used. The impurity is injected (similar to the above) at a dosage level of $5 \times 10^{15}$ atoms per $cm^{-2}$, at energy of 30 Kev, using an ion driving method. A part of the previously existing n-type impurity region 24 is punched out to make the p-type region 25. Resist mask 28 is removed with hydrogen fluoride. In FIG. 6C, a second insulation layer 29, preferably $SiO_2$ about 2,000 Å thick, is deposited using a CVD method. A part of the second insulation layer 29 is removed by a photo-etching method (e.g., with a hydrogen fluoride aqueous solution) to expose a part of region 25. Note how the second insulation layer overlaps the junction (that forms the diode) between regions 24 and 25. Heat is then applied to activate each impurity. The heat treatment is preferably 1,000° C. for 60 seconds in a $N_2$ atmosphere. In FIG. 6D, an intrinsic silicon film 30 is deposited by a CVD method. Film 30 is the heart of the switch that will go from OFF to ON when a breakdown voltage and resulting current is passed through it. Film 30 is preferably 1,000 Å thick to 2,000 Å thick. Excess parts of the intrinsic silicon film 30 are removed by photo-etching. A wiring layer 31 of one micron thick aluminum is deposited on top of intrinsic silicon film 30 to complete the fabrication of the device.

When forming a memory cell and diode in the polycrystalline silicon film in the above manner, the OFF state resistance value is better than one megohm, and in the ON state it can be less than one kilo-ohm, when the contact hole diameter is about 1.2 microns. The difference in current between the ON state and the OFF state is therefore substantial. Impurities from the lower p-type region are theorized to surge into the breakdown location during programming from the OFF to the ON state. The above methods can use conventional technology to make the diodes on polycrystalline silicon with n-type and p-type regions. By using photo-etching and ion driving, the number of process steps is minimal.

Third Embodiment—A third embodiment of the present invention (FIG. 8) has a structure wherein a first insulation layer 42 is deposited on a substrate 41, a first silicon film 49 is injected with a high impurity concentration and after being deposited on the first insulation layer 42, a second insulation layer 50 is deposited on the first silicon film 49, first contact holes are opened up in the second insulation layer 50, a second silicon film 51 is deposited on the second insulation layer 50 and in the first contact holes, a third insulation layer 52 is deposited on the second silicon film 51, a second contact hole is opened up in the third insulation layer 52, a metal film 53 is deposited on the second silicon film 51 in the second contact hole. An intrinsic silicon layer 54 is deposited on the metal film 53. An aluminum wiring layer 55 is deposited over the metal film 53, and the second silicon film 51 and the metal film 53 comprise a Schottky barrier diode. Care is taken to avoid placing any of the second contact holes directly over a first contact hole. FIG. 8 is a cross-sectional view of a third embodiment of the present invention. FIGS. 9A through FIG. 9D are cross-sectional views of the principal stages of the manufacturing process steps.

In FIG. 9A, first insulation layer 42 of $SiO_2$ is deposited with a CVD method (e.g., chemical gas phase growing) onto substrate 41, about 2,000 Å thick. A layer 3,000 Å thick of polycrystalline silicon film 49 is deposited on the first insulation layer 42 also by a CVD method, such as by conventional pyrolysis of monosilane gas. To lower the resistance of first polycrystalline silicon film 49, an phosphorus atoms, for example, are injected using an ion driving method to get a concentration over $1 \times 10^{15}$ atoms per $cm^{-2}$. Arsenic can also be used, instead of the phosphorus. The second insulation layer 50 is deposited 3,000 Å thick on the first polycrystalline silicon film 49 using a CVD method. Layer 50 can also be comprised of $SiO_2$ film. First contact holes are opened up with a photo-etching process. In FIG. 9B, second polycrystalline silicon film 51 (the n-type silicon for the Schottky barrier diodes) is deposited 3,000 Å thick. To change the silicon film to n-type, phosphorus atoms (for example) are injected, using an ion driving method. The dosage must be carefully controlled because it ultimately determines important performance properties of the Schottky barrier diodes. To minimize both the diode reverse current and the polysilicon sheet resistance simultaneously, a doping of about $1 \times 10^{13}$ to $1 \times 10^{14}$ atoms per $cm^{-2}$ will be best.

The device is then heated in a $N_2$ atmosphere, in order to activate the impurities of the first and the second polycrystalline films 49 and 51. Heating should be 1,000° C. for about 60 seconds; a halogen lamp will do this nicely. In FIG. 9C, the third insulation layer 52 is deposited as an interlayer insulation layer. The $SiO_2$ layer 52 should be about 3,000 Å, and a CVD method is preferably used to do the deposition. Then, parts of the third insulation layer 52 are removed by a photo-etching method at the places where the Schottky diodes are to be formed. This etch uses a hydrogen fluoride solution with an organic resist (and is conventional in the manufacture of semiconductors). Titanium metal films 53 are deposited by a sputtering method over the entire surface, which is then heated to 700° C. for about 60 seconds using a halogen lamp. The heat causes metal film 53 to react where it contacts the second polycrystalline silicon film 51, to become titanium silicide. These reactions occur in the contact holes that were opened up in the insulation layer. (Titanium is used only as an example here, other refractory metals are just as suitable.) The unreacted metal is washed away with a solution of ammonia, water, and hydrogen peroxide. Referring to FIG. 9D, the several intrinsic silicon films 54 are deposited 2,000 Å thick with a CVD method. Their deposition is similar to the way first polycrystalline silicon film 49 and second polycrystalline silicon film 51 were done. The excess is removed with a photo-etching method. Metalization wirings 55 are deposited onto the third insulation layer 52 and intrinsic silicon films 54. Sputtering and excess aluminum removal are done in the conventional way. By putting the Schottky barrier diodes directly over the second insulation layer 50, the migration distance for impurities to travel from the lower layer wiring (layer 49) to the Schottky barrier diodes is lengthened. Consequently even if impurities in layer 49 diffuse into silicon film 51 during heating (such as when annealing), the impurities will not reach the interface with titanium film 53 that makes the Schottky barrier diode work.

Fourth Embodiment—FIG. 11A through FIG. 11E are cross-sectional views of a memory device after each of the principal stages of fabrication, the method described here is a fourth embodiment of the present invention. Refer now to FIGS. 11A–11E. A first insulation layer 102 of $SiO_2$ is deposited with a CVD method (chemical vapor phase growth method) or a hot oxidation method in an oxygen-nitrogen atmosphere deposited about 3,000 Å thick on a substrate 101. Then a polycrystalline silicon film 103 is deposited to about 5,000 Å thick with a CVD method, e.g., by pyrolyzing monosilane gas at a temperature of about 620° C. Then a group V element (for example phosphorus or arsenic) is injected to make an n-type region 104. A conventional ion driving method is used. The dosage level should be about $1 \times 10^{14}$ atoms per $cm^{-2}$. In FIG. 11B, the excess silicon film 103 is removed by a conventional photo-etch. A second insulation layer 105 of $SiO_2$ 5,000 Å thick is deposited using a CVD method onto silicon film 103. In FIG. 11C, a first contact hole 107 is opened up in insulation layer 105 over the desired position of p-type region 106 using a conventional photo-etch. After removing resist mask, a group III element (boron for example) is injected through hole 107 to make the p-type region 106 in film 103, using a conventional ion driving method, with a dosage level set higher than that for the group V element. (About $1 \times 10^{15}$ atoms per $cm^{-2}$.) Part of n-type region 104 is thereby converted into p-type region 106. Since second insulation layer 105 is used as a mask, no group III elements will be injected into the n-type region 104 outside of contact hole 107. In FIG. 11D, a second contact hole 111 is opened up in layer 105 using conventional photo-etch. A heat treatment activates the group V and group III impurity elements. Annealing is done at 1,000° C. for one minute in a nitrogen atmosphere using a halogen lamp. In FIG. 11E, aluminum is deposited as wiring 110 with a sputtering method to fill the first contact hole 107 and the second contact hole 111 with their respective electrical connections. Excess aluminum is removed with a photo-etching method. A P-N junction diode is thereby fabricated between wiring 110 in holes 107 and 111. By substituting the second insulation layer 105 for the ion driving mask to make the p-type region, the p-type region 106 and the first contact hole 107 are self-aligning. There is no need to have a margin for error, and extreme miniaturization becomes possible. This significant benefit is achieved without having to increase the number of processing steps. The above description should not be construed as limiting. For example it is possible to interchange the group III and group V impurities. The above example injects group III impurity ions after removing the photoresist to make the first contact hole, but it is possible to obtain the identical effect by forming a photoresist for the contact hole, etching the first contact hole 107, inject the group III impurity ions, and then remove the photoresist. In this case, the film thickness of the second insulation layer 105 can be thinner.

Fifth Embodiment—FIG. 13 is a cross-section of a semiconductor device according to a fifth embodiment of the present invention. FIGS. 14A-14D show of the principal stages in the manufacturing process of making the device of FIG. 13. In FIG. 14A, a first insulation layer 142 of $SiO_2$ is deposited 5,000 Å thick by a CVD method (chemical vapor phase growing method) on substrate 141. Then 2,000 Å of polycrystalline silicon film is deposited as first silicon film 143 on the first insulation layer 142 by CVD method, such as a conventional pyrolysis of monosilane gas. The resistance is reduced in the film 143, in order to make it suitable for use as wiring. A group V element (e.g., phosphorus or arsenic) is used as an impurity at a dosage level of greater than $6 \times 10^{15}$ atoms per $cm^{-2}$, and is injected using a conventional ion driving method. In FIG. 14B, a second polycrystalline silicon 145 is deposited about 5,000 Å thick using, for example, the same CVD method as was used to deposit the first polycrystalline silicon film. Again, a group V element (e.g., phosphorus or arsenic for example) is injected using an ion driving method in order to prepare this area to be the n-type region of the P-N junction diode. A dosage level of about $1 \times 10^{12}$ to $1 \times 10^{14}$ atoms per $cm^{-2}$ is preferred. In FIG. 14C, a second insulation layer 147 is deposited about 4,000 Å thick on second polycrystalline silicon 145 by a CVD method. Then contact hole 148 is opened up in the second insulation layer 147 by a photo-etching method. A third polycrystalline silicon film 149 is deposited in the contact hole 148 by a CVD method. A group III element (e.g., boron for example) is injected using an ion driving method in order to make the p-type region of the P-N junction diode. A dosage level of about $1 \times 10^{15}$ atoms per $cm^{-2}$ is preferred. In FIG. 14D, excess polycrystalline silicon film is removed by a photo-etching method. Heat is used to activate each of the impurities. The heat treatment is preferably 1,000° C. for about 60 seconds in a $N_2$ atmosphere using a halogen lamp. After this, 5,000 Å thick of a fourth polycrystalline silicon film 151 is deposited by a CVD method. Then as in FIG. 13, the excess film 151 is removed by a photo-etching method, after which 1,000 Å thick of aluminum is sputtered to form upper wiring layer 152. A photo-etching step defines the ultimate wiring connections.

The device of FIG. 13 is produced by the above steps related to FIGS. 14A-14D. When the P-N junction diode is made using polycrystalline silicon, for example, and the contact hole diameter is 1.2 micron, the OFF state will be about one megohm, and the ON state will have a very low resistance, about 500 ohms.

The present invention is not restricted to the above example. For instance, even though the resistance value is adequate when using polycrystalline silicon injected with a high impurity concentration, a metal layer or a compound of silicon and metal can do as well for the lower wiring layer. In such cases, since it is possible to have them also act as gate electrodes for current sensing circuit transistors, the number of process steps would be decreased, and the efficiency would be improved.

Sixth Embodiment—A semiconductor device (FIG. 15) according to a sixth embodiment of the present invention comprises a first insulation layer 162 deposited on a substrate 161, a first silicon 163 (containing a p-type or an n-type impurity in high concentrations) is deposited on the first insulation layer 162, a second insulation layer 164 is deposited on the first silicon film 163, first contact holes 172 are opened up in the second insulation layer 164, a second silicon film 166 is deposited on the second insulation layer 164 and the first contact holes 172, a third insulation layer 173 is deposited on the second silicon film 166, second contact holes 176 are opened up in the third insulation layer 173, a third silicon film 174 is deposited in the second contact holes 176, and a wiring layer 175 is deposited on the third silicon film 174. The impurity used in the first silicon film 163 also used in the second silicon film 166. The second contact holes 176 avoid being positioned over the first contact holes 172. A P-N junction diode is formed in the second silicon film 166 by injecting impurities through hole 174, using insulation layer 173 as a mask.

Please refer to FIG. 16A through FIG. 16E. In this example, an intrinsic silicon film is deposited over a p-type region. In FIG. 16A, first insulation layer 162 is deposited with a CVD method (chemical vapor phase growing method) on substrate 161. It is 5,000 Å thick and comprises $SiO_2$. Then about 2,000 Å of first polycrystalline silicon film 163 is deposited on the first insulation layer 162 by a CVD method. The polycrystalline silicon is deposited by conventional pyrolysis of monosilane gas. Then in order to lower the resistance (to make good wiring), a group V element (e.g., phosphorus or arsenic for example) is driven in at a dosage level over $1 \times 10^{15}$ atoms per $cm^{-2}$ using an ion driving method. Then second insulation layer 164 is deposited to be 4,000 Å thick on the first polycrystalline silicon film 163 by a CVD method. First contact holes 172 are opened up in the second insulation layer 164, where the n-type region of the P-N junction region will be later located. Next, as shown in FIG. 16B, second polycrystalline silicon film 166 is deposited about 5,000 Å thick using a CVD method similar to the first polycrystalline silicon film 103. In order to transform an area into n-type region 166, a group V element (e.g., phosphorus or arsenic for example) is injected using an ion driving method at a dosage level of about $1 \times 10^{13}$ atoms per $cm^{-2}$. In FIG. 16C, p-type regions 167 in the second polycrystalline silicon 166, use resist masks 168 that are deposited over the other parts of the second polycrystalline silicon film 166 and a p-type impurity (group III element) is injected, in a similar manner as the n-type region 166. An impurity of boron, in a dosage level of $5 \times 10^{15}$ atoms per $cm^{-2}$, is used. The p-type region is recovered from the n-type region, using ten times the amount of impurity used in the n-type region 166. The resist mask 168 is removed with, for example, hydrogen fluoride. In FIG. 16D, third insulation layer 173 is deposited. The $SiO_2$ layer is deposited about 4,000 Å thick by a CVD method. Then second contact holes 176 are opened up by removing parts of the third insulation layer 173 with a photo-etching method. Etching can be done effectively with an aqueous solution of fluorine. Heat is applied to activate each impurity. The preferred heat treatment is 1,000° C. for 60 seconds in a $N_2$ atmosphere using a halogen lamp. In FIG. 16E, intrinsic silicon film 174 that is the switch is deposited by a CVD method. About 3,000 Å thick. Then the excess intrinsic silicon film 174 is removed by a photo-etching method. Aluminum is deposited 10,000 Å thick on intrinsic silicon film 174 by sputtering. This forms upper wiring layer 175, which is trimmed to final shape by a photo-etching method.

The device of FIG. 15 is obtained by the processes above. When polycrystalline silicon has P-N junction diodes formed in this manner, and contact hole are 1.2 microns, there is one megohm in the OFF state, but in the ON state it is possible to have a very low resistance at 500 ohms. Consequently the voltage drop across the diode will not be very high, even when the forward current is large. The difference is current between the ON state and the OFF state will be widely separate.

The technology needed to make a P-N thin film junction diode using polycrystalline silicon is simple and conventional. Because the path from the first contact hole 172 to the second contact hole 176 is long, the P-N connection junction can be preserved, even after heat treatment. High concentrations impurities from n-type region 166 and p-type region 167 will not cause trouble, even though they diffuse considerably.

Although the lower layer wiring described above used heavily doped polycrystalline silicon, a metal layer or a compound of silicon and metal could also be used with good results. Since the lower the resistance value the better. Such metal can also serve as a transistor gate electrode of a current sensing circuit, the number of processes will decrease and efficiency will improve.

The above discussion has been in terms of an antifuse-based PROM, but the present invention is also effective for memory cells using TTL input circuits, bipolar transistors, and Schottky barrier diodes. Although the above examples used polycrystalline silicon film in the lower layer wiring, the impurity diffusion layers can also be formed in the substrate.

Sixth Embodiment First Variation—A first variation is possible in the device of FIG. 15. Instead of making layer 174 out of an intrinsic silicon film that is deposited by a CVD method about 3,000 Å thick; Layer 174 can be about 200 Å of silicon dioxide or silicon nitride, and can be also deposited by conventional means. (Thin deposits of SiO2 are very common in the fabrication of EEPROMs that depend on Fowler-Nordheim tunneling for their operation.) Until programmed, layer 174 acts as an insulator. During programming, layer 174 is subjected to a high enough voltage to cause a dielectric breakdown, about 20 volts for 200 Å of $SiO_2$. After programming, layer 174 will be so contaminated with material from adjacent layers, that it will permanently behave thereafter as a short.

Sixth Embodiment Second Variation—A layer of titanium-nitride (TiN) can be deposited between the amorphous silicon layer 174 and aluminum wiring layer 175 to improve the chemical reaction that occurs in layer 174 during programming. The deposit can be done with conventional processes. The TiN will combine with the silicon of layer 174 as a result of the heat being generated during programming to form conductive compounds that help lower the ON (programmed) resistance of the memory cell.

Seventh Embodiment—The seventh embodiment (FIGS. 17A–17C) of the present invention is a memory device comprising a substrate 181, an element separation insulation layer 182, a first n-type (or a so-called "polycide" formed after a reaction with a high melting-point "refractory" metal deposited on the surface) conductor layer 183 deposited from material that can also be used as a gate electrode, a first interlayer insulation layer 184, a first aperture 185, a first n-type polysilicon layer 186, a p-type polysilicon layer 187, a second interlayer insulation layer 188, a second aperture 189 opened up in p-type polysilicon layer 187 positioned over first aperture 185, and a wiring layer 190 made of, for example, aluminum. FIG. 17A illustrates how individual memory cells (represented by switches in series with diodes) are connected at each intersection of bit and word lines. The bit lines are equivalent to layer 183 and the word lines are equivalent to aluminum metal wiring layer 190.

The seventh embodiment is therefore a masked read only memory (ROM) that stores data by having, or not having, an aperture 189 that will allow wiring layer 190 to contact the p-type polysilicon layer 187. Since layer 187 is p-type and since layer 186 is n-type, a plurality of P-N junction diodes are formed that are each in series with the contact through aperture 189.

The device is also easy to make because insulation layer 184 is between conductor layer 183 and polysilicon layers 186 and 187. If conductor layer 183 is in contact with polysilicon layer 186 and 187 over its entire surface, both must be etched in succession. If aluminum wiring layer 190 and conductor layer 183 are to be directly connected, a problem is created because the contact resistance gets too high (due to the path through polysilicon layer 186). But if it passes through insulation layer 184, the etching can be eliminated. Polycrystalline layers 186 and 187 can be separately etched from conductor layer 183. Conductor layer 183 can then be directly connected to wiring layer 190.

This method makes possible the memory cell of FIG. 17B, which lends itself readily to micro-miniaturization. By passing a current between a P-N junction (wiring layer 190 and conductor layer 183), rather than through a transistor, the resistance is comparatively lower than the ON resistance of the transistor. The device is therefore intrinsically faster. Data is written by the presence or absence of a contact via aperture 187. The manufacturing period is also shortened.

Eight Embodiment—The eighth embodiment (FIG. 19A) of the present invention comprises a first insulation layer deposited on a substrate, a first conductor layer containing a first conductive type impurity deposited on the first insulation layer, a second insulation layer deposited on the surface containing the first conductor layer, first apertures deposited in prescribed portions of the second insulation layer over the first conductor layer, a second conductor layer comprising polysilicon containing a first conductive type impurity in direct contact with the first conductor layer at the first apertures, a third insulation layer deposited on the second conductor layer, second apertures deposited in portions other than over the first apertures in prescribed portions of the third insulation layer, Schottky diodes comprising high melting point metal silicide deposited on the second conductor film inside the second apertures, and a third conductor layer principally comprised of aluminum which is deposited over the second apertures. In FIGS. 19B and 19C, a memory device according to the present invention comprises a substrate 201, an element separation insulation layer 202, a conductor layer 203, a first interlayer insulation layer 204, a first aperture 205, a first conductive type polysilicon layer 206 having an n-type impurity, a second interlayer insulation layer 208, a second aperture 209 formed over first aperture 205, a Schottky diode 207 comprised of a high melting point metal (refractory metal) silicide deposited over the polysilicon layer 206 inside second aperture 209, and a wiring layer 210 of aluminum (for instance). Layer 203 can be made of the same material as a gate electrode and may have a first conductive type impurity e.g., polysilicon containing n-type impurity, or a so-called polycide deposited by a high melting point metal silicide on the surface. This device stores data in a manner similar to the device of FIG. 17A-17C.

This eighth embodiment differs from the above described seventh embodiment by its positioning of first apertures 205 at other than directly over the second apertures. The Schottky diode region 207 will not be poisoned by n-type impurities diffusing from heavily doped conductor layer 203 into overlying polysilicon layer 206 (such migrations are likely during heat treatments in later processes). Any such impurities must travel a path around insulating layer 204, and such a path will be too long for any amount of migration that can reasonably be expected.

Ninth Embodiment—FIGS. 20A-20C illustrate a ninth embodiment of the present invention, which is a ROM memory device comprising a substrate 221, an element separation insulation layer 222, a conductor layer 223, a first interlayer insulation layer 224, a first aperture 225, a first type polysilicon layer 226 containing an n-type impurity, 228 is a second interlayer insulation layer, a second aperture 229 located directly over first aperture 225, a Schottky diode results from depositing a high melting point metal silicide (layer 227) on polysilicon layer 226 (inside second aperture 229), and an aluminum wiring layer 230. The area "A" in FIG. 20B is an individual memory cell. Conductor layer 223 is typically made from the same material as a gate electrode in the sensing circuits and has a first type impurity, e.g., polysilicon containing n-type impurity, or so-called polycide deposited by a high melting point metal silicide on the surface. This embodiment is similar to the seventh embodiment described above. Data is stored in the same way. The Schottky diode functionally replaces the P-N junction diode created at the interface of regions 186 and 187 (FIG. 17C). Layer 223 serves as the bit line interconnect and can have a much heavier doping than layer 226. That way, layer 226 can be lightly enough doped to keep the diode diffusion current down to acceptable levels, without sacrificing memory cell programmability or readability, especially at memory cell locations on the fringes.

Tenth Embodiment—FIGS. 21A-21C illustrate a tenth embodiment of the present invention, similar to the seventh and eighth embodiments, and is a ROM memory device comprising a substrate 241, an element separation insulation layer 242, a conductor layer 243 for bit line interconnecting, a first interlayer insulation layer 244, a first aperture 245, a first conductive type a polysilicon layer 246 containing an n-type impurity, a second conductive type polysilicon layer 247 containing p-type impurity, a second interlayer insulation layer 248, a second aperture 249 deposited over a polysilicon layer containing p-type impurity over first opening 245, and an aluminum wiring layer 250. Area "A" in FIG. 21B is a single memory cell. Layers 246 and 247 form the P-N junction diode described in several of the embodiments above. Apertures 245 and 249 are staggered and are not vertically aligned. This gives the advantage, described above, of presenting a long migration path to migrating impurities. The fabrication of the ROM device is easier because of insulation layer 244 placed between conductor layer 243 and polysilicon layers 246 and 247.

Eleventh Embodiment—FIGS. 22 and 23A-20F illustrate an eleventh embodiment of the present invention, which is a antifuse-based memory device comprising a first insulation layer 262 deposited with a CVD method on substrate 261. Layer 262 is preferably 5,000 Å thick and comprises $SiO_2$. About 2,000 Å of a first polysilicon film 263 is deposited on the first insulation layer 262 by a CVD method, such as by conventional pyrolysis of monosilane gas. To lower the resistance of layer 263 enough to transform it into an acceptable wiring layer, a group V element (e.g., phosphorus or arsenic) is driven in at a dosage level of over $1 \times 10^{15}$ atoms per $cm^{-2}$, using an ion driving method. Layer 263 is then useful as bit line wiring. A second insulation layer 264 is deposited 4,000 Å thick on the first polysilicon film 263 by a CVD method. First contact holes 272 are opened up in second insulation layer 264 at sites selected for the isolation diodes associated with each memory cell. FIG. 23B shows second polysilicon film 265 being deposited using a CVD method 269. Layer 265 is deposited about 5,000 Å thick in practically the same manner as first polysilicon film 263. In order to convert this area into an n-type region 266 (to produce the P-N junction diode), a group V element (e.g., phosphorus or arsenic) is injected using an ion driving method. A target dosage level of about $1 \times 10^{13}$ atoms per $cm^{-2}$ is preferred. In FIG. 23C, the p-type region 267 in second polysilicon layer 265 is made by depositing resist mask 268 and then injecting a p-type impurity (group III element) in the exposed areas. An ion driving method is used to achieve a dosage level of boron that is $5 \times 10^{15}$ atoms per $cm^{-2}$. The p-type region rises out of the n-type region by injecting ten-fold the amount of impurities than was in the n-type region 186. Resist mask 108 is removed with hydrogen fluoride, or equal solvent. In FIG. 23D, a third insulation layer 273 is deposited; consisting of $SiO_2$, the layer is deposited about 4,000 Å thick by a CVD method. Second contact holes 276 are opened up by removing parts of the third insulation layer 273 that are directly over the p-type regions 267. A photo-etch with an aqueous solution of fluorine is used. The impurities are then activated by a heat treatment of 1,000° C. for 60 seconds in a $N_2$ atmosphere (preferably using a halogen lamp). In FIG. 23E, a metal film 277 is deposited over the surface by sputtering titanium. Other refractory metal can also be used. A heat treatment is done at 700° C. for 60 seconds, again using a halogen lamp. The titanium metal film 277 where the third insulation layer 273 was removed will react with the second polysilicon film 265 to produce titanium silicide. Excess metal film 277 is then washed away with a solution of ammonia and hydrogen peroxide.

The antifuse layer is built by depositing about 2,000 Å on intrinsic silicon film 274 on the surface (FIG. 23F). The excess intrinsic silicon film 274 is removed by a photo-etch step. A cap of aluminum 275 (FIG. 22 only) is deposited 10,000 Å thick on the surface of intrinsic silicon film 274 and outside second contact holes 276 on the surface of third insulation layer 273. The aluminum layer 275 is used as a word line interconnect between memory cells. Layer 275 is then photo-etched into a final wiring interconnect.

The prior art has an n-type doping concentration of $10^{17}$ atoms per $cm^{-2}$ for the Schottky diode. The present invention has a concentration about $10^{20}$ atoms per $cm^{-2}$. The memory cell has a low ON resistance. Although metal film in the present invention does not play a role in the Schottky diode, the metal is necessary for programming. The metal film is theorized to play a role in lowering the resistance of the intrinsic silicon film after programming. Since the distance from the first contact hole 272 to the second contact hole 276 is relatively long, there is little influence felt from the p-type region 267 after heat treatment, even if the lower layer n-type region 266 has diffused quite a lot. This makes it easy to keep the R-N junction from getting poisoned.

Alternatively, a metal layer or a compound of silicon and metal can be used in the lower wiring layer 263, since the lower the resistance, the better. Such a layer can also serve double duty as a transistor gate electrode (e.g., of the current sensing circuit). This would have the positive effect of decreasing the number of process steps and improving efficiency.

While the above discussion is in terms of antifuse-based PROMs, the techniques can also be effective for memory cells using TTL input circuits or bipolar transistors and Schottky barrier diodes. Although the present example used polysilicon film in the lower layer wiring, practically the same result can be obtained by diffusing impurity layers directly into the substrate.

FIG. 24 shows a top elevational view of a memory device, similar to that of FIG. 21B. The dimensions are in microns and show a memory cell can be repeated in an area 3.5 by 3.4 microns. First and second polysilicon layers (PLYA, PLYB) are 2.6 microns wide, as is the aluminum interconnect (AL). A gap of 0.8 microns exists between adjacent polysilicon layers.

In all of the above embodiments that have described the use of intrinsic silicon as the antifuse programming material, silicon oxide and silicon nitride can be used instead. Among other advantages, these alternative materials offer advantages in the ease in which devices can be fabricated using these materials. Furthermore, the compounds formed after programming in the reactions between the refractory metal films and the antifuse programming material alternatives suggested here can have desirable ON and OFF resistances different than are obtained with intrinsic silicon.

In the above description, the phrase "semiconductor substrate" has been avoided when referring the substrates the above embodiments incorporate, because the invention is not so limited. Other substrate materials, such as silica, are also good substrate materials for purposes of the present invention.

While the invention has been described in conjunction with specific embodiments, it is apparent to those skilled in the art that many further alternatives, modifications, and variations is possible, in light of the foregoing disclosure. Thus, the invention described herein is intended to embrace all such alternatives, modifications, applications, equivalents, and variations as fall within the spirit and scope of the claims below.

What is claimed is:

1. An antifuse PROM memory device formed on a substrate, comprising:
    a first insulation layer on the substrate;
    a silicon layer on the first insulation layer, the silicon layer including regions having a first conductivity type and a region having a second conductivity type opposite to the first type so that at least one P-N junction diode is formed substantially in parallel with the first insulation layer;
    a second insulation layer on the silicon layer, the second insulation layer including a contact hole which exposes a portion of the region having the second conductivity type in the silicon layer;
    antifuse means in the contact hole and vertically in contact with the portion of the region exposed in the silicon layer for allowing programming of the device such that the antifuse means is directly connected to the P-N junction diode in the forward direction of the P-N junction diode; and
    a conductive layer on the antifuse means.

2. A semiconductor device formed on a substrate, comprising:
    a first insulation layer on the substrate;
    a first silicon layer on the first insulation layer;
    a second insulation layer on the first silicon layer, the second insulation layer including a plurality of openings;
    a second silicon layer on the second insulation layer and in the openings and in contact with the first silicon layer, the second layer having an conductivity type same as that of the first silicon layer and an impurity concentration substantially lower than that of the first silicon layer;
    a third insulation layer on the second silicon layer, the third insulation layer including a contact hole between the openings;
    a metal layer in the contact hole and in contact with the second silicon layer to form a Schottky barrier diode; and
    a wiring layer covering the contact hole.

3. The device of claim 2, wherein:
    the wiring layer and the first and second silicon layers form a matrix such that the contact hole is located at an intersection thereof.

4. The device of claim 2, further comprising:
    antifuse means between the metal layer and the wiring layer for allowing programming of the device.

5. A semiconductor device formed on a substrate, comprising:
    a first insulation layer on the substrate;
    a first silicon layer on the first insulation layer, the first silicon layer having a first conductivity type;
    a second insulation layer on the first silicon layer, the second insulation layer including a plurality of openings;

a second silicon layer on the second insulation layer and in the openings in contact with the first silicon layer, the second silicon layer including regions having the first conductivity type and an impurity concentration substantially lower than that of the first silicon layer and a region having a second conductivity type opposite to the first type so that at least one P-N junction diode is formed substantially in parallel with the second insulation layer;

a third insulation layer on the second silicon layer, the third insulation layer including a contact hole which exposes a portion of the region having the second conductivity type in the second silicon layer, the contact hole positioned between the openings; and a wiring layer covering the contact hole.

6. The device of claim 5, wherein:
the first silicon layer comprises a metal silicide.

7. The device of claim 5, wherein:
the first and second silicon layers are arranged in a matrix with the wiring layer, with the contact hole positioned at an intersection thereof.

8. A masked read only memory (ROM) on a substrate, comprising:

a first insulation layer on the substrate;

a first conductive layer having a first conductivity type on the first insulation layer;

a second insulation layer on the first conductive layer, the second insulation layer including a plurality of apertures;

a second conductive layer including regions having the first conductivity type on the second insulation layer and regions having a second conductivity type opposite to the first type in the apertures so that at least one P-N junction diode is formed substantially in parallel with the second insulating layer;

a third insulation layer on the second conductive layer, the third insulation layer including a contact hole over an aperture, the contact hole exposing a region having the second conductivity type in the second silicon layer, the absence or presence of a contact hole over an aperture representing data; and a third conductive layer in the contact hole and in contact with the region having the second conductivity type in the second conductive layer.

9. The ROM of claim 8, wherein:
the regions having the second conductivity type in the second conductive layer are p-type polysilicon;
the regions having the first conductivity type in the second conductive layer are n-type polysilicon;
the first and second insulation layers comprise silicon dioxide; and
the third conductive layer comprises aluminum.

10. A semiconductor device on a substrate, comprising:

a first insulation layer on the substrate;

a first conductive layer on the first insulation layer;

a second insulation layer on the first conductive layer, the second insulation layer including a plurality of apertures;

a second conductive layer on the second insulation layer and in contact with the first conductive layer in the first apertures, the second conductive layer having a conductivity type same as that of the first conductive layer;

a third insulation layer on the second conductive layer, the third insulation layer including a contact hole between the apertures, the contact hole exposing the second conductive layer;

a refractory metal silicide layer disposed within the contact hole to form a Schottky diode; and a third conductive layer covering the contact hole and in electrical communication with the Schottky diode.

11. A semiconductor ROM memory device formed on a substrate, comprising:

a first insulation layer on the substrate;

a first conductive layer on the first insulation layer;

a second insulation layer on the first conductive layer, the second insulation layer including a plurality of apertures;

a second conductive layer on the second insulation and in contact with the first conductive layer in the apertures, the second conductive layer having a conductivity type same as that of the first conductive layer;

a third insulation layer on the second conductive layer, the third insulation layer including a contact hole positioned directly over an aperture;

a refractory metal silicide layer disposed in the contact hole and in contact with the second conductive layer to form a Schottky diode; and a third conductive layer in contact with the metal silicide layer in the contact hole, the presence or absence of a contact hole representing data.

12. A semiconductor ROM memory device formed on a substrate, comprising:

a first insulation layer on the substrate;

a first conductive layer on the first insulation layer, the first conductive layer having a first conductivity type;

a second insulation layer on the first conductive layer, the second insulation layer including a plurality of apertures;

a second conductive layer including regions having the first conductivity type in contact with the first conductive layer in the apertures and regions having a second conductivity type opposite to the first type on the second insulation layer so that at least one P-N junction is formed substantially in parallel with the second insulation layer;

a third insulation layer on the second conductive layer, the third insulation layer including a contact hole positioned directly over an aperture, the contact hole exposing a region in the second conductive layer, the presence or absence of a contact hole representing data; and a third conductive layer covering the contact hole and in contact with the region exposed.

13. The device of claim 12, wherein:
the exposed region has the second conductivity type in the second conductive layer.

14. A semiconductor memory device formed on a substrate, comprising:

a first insulation layer on the substrate;

a first silicon layer on the first insulation layer, the first silicon layer having a first conductivity type;

a second insulation layer on the first silicon layer, the second insulation layer including a plurality of openings;

a second silicon layer on the second insulation layer and in the openings in contact with the first silicon layer, the second silicon layer including regions having the first conductivity type and an impurity concentration substantially lower than that of the first silicon layer and a region having a second conductivity type opposite to that of the first type so that at least one P-N junction diode is formed substantially in parallel with the second insulation layer;

a third insulation layer on the second silicon layer, the third insulation layer including a contact hole which exposes a portion of the region having the second conductivity type in the second silicon layer, the contact hole positioned between the openings;

a metal film in the contact hole;

a third silicon layer on the metal film; and a wiring layer covering the contact hole.

15. The device of claim 14, wherein:

the first silicon layer is arranged in lattice form with the wiring layer, and the contact hole is located at an intersection.

16. The device of claim 1, wherein the first conductivity type is an n-type and the second conductivity is a p-type.

17. The device of claim 16, wherein a region of the second conductivity type is sandwiched between two regions of the first conductivity type in the silicon layer.

18. The device of claim 4, wherein the first and second silicon layers have an n-type conductivity.

19. The device of claim 18, wherein the metal layer is a refractory metal layer.

20. The device of claim 5, further comprising antifuse means in the contact hole between the region exposed in the second silicon layer and the wiring layer for allowing programming of the device.

21. The device of claim 20, wherein the first conductivity type is an n-type and the second conductivity type is a p-type.

22. The device of claim 11, wherein the conductivity type of the first and second conductive layers are n-type.

23. The device of claim 12, wherein the first conductivity type is an n-type and the second conductivity type is a p-type.

24. The device of claim 14, wherein the first conductivity type is an n-type and the second conductivity type is a p-type.

* * * * *

UNITED STATES PATENT AND TRADEMARK OFFICE
CERTIFICATE OF CORRECTION

PATENT NO. : 5,311,039
DATED       : May 10, 1994
INVENTOR(S) : Masakazu Kimura et al.

It is certified that error appears in the above-identified patent and that said Letters Patent is hereby corrected as shown below:

Column 18, Claim 2, Line 10, change "an" to --a--.

Column 18, Claim 2, Line 11, insert --the-- after "type".

Column 18, Claim 4, Line 2, insert --in the contact hole-- after "means".

Column 19, Claim 8, Line 14, change "Insulating" to --insulation--.

Column 19, Claim 10, Line 10, delete "first".

Column 19, Claim 10, Line 11, insert --the-- after "type".

Column 20, Claim 11, Line 11, insert --the-- after "type".

Column 18, Claim 2, Line 10, after "second" insert --silicon--.

Signed and Sealed this

Twenty-sixth Day of September, 1995

Attest:

BRUCE LEHMAN

*Attesting Officer*     *Commissioner of Patents and Trademarks*